(12) United States Patent
Kim et al.

(10) Patent No.: US 12,274,012 B2
(45) Date of Patent: Apr. 8, 2025

(54) ELECTRONIC APPARATUS

(71) Applicant: Samsung Display Co., Ltd., Yongin-si (KR)

(72) Inventors: Tae-Sung Kim, Bucheon-si (KR); Koichi Abe, Hwaseong-si (KR); Youngji Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 353 days.

(21) Appl. No.: 17/972,092

(22) Filed: Oct. 24, 2022

(65) Prior Publication Data
US 2023/0209743 A1 Jun. 29, 2023

(30) Foreign Application Priority Data
Dec. 29, 2021 (KR) .................... 10-2021-0191804

(51) Int. Cl.
| | |
|---|---|
| *H04R 25/00* | (2006.01) |
| *H04R 1/02* | (2006.01) |
| *H05K 5/00* | (2006.01) |
| *H05K 5/02* | (2006.01) |
| *H05K 5/03* | (2006.01) |

(52) U.S. Cl.
CPC ............ *H05K 5/0217* (2013.01); *H04R 1/028* (2013.01); *H05K 5/0018* (2022.08); *H05K 5/03* (2013.01); *H04R 2499/15* (2013.01)

(58) Field of Classification Search
CPC .... H04R 1/028; H04R 1/2819; H04R 1/2834; H04R 2440/05; H04R 2499/15
USPC ........................................................ 381/388
See application file for complete search history.

(56) References Cited

U.S. PATENT DOCUMENTS

| | | | |
|---|---|---|---|
| 9,818,805 | B2 | 11/2017 | Choi et al. |
| 10,009,683 | B2 | 6/2018 | Choi et al. |
| 10,129,646 | B2 | 11/2018 | Choi et al. |
| 10,142,738 | B2 | 11/2018 | Choi et al. |
| 10,142,739 | B2 | 11/2018 | Choi et al. |
| 10,219,079 | B2 | 2/2019 | Choi et al. |
| 10,416,707 | B2 | 9/2019 | Choi et al. |
| 10,491,985 | B2 | 11/2019 | Lee et al. |

(Continued)

FOREIGN PATENT DOCUMENTS

| | | | | |
|---|---|---|---|---|
| EP | 4207799 A1 | * | 7/2023 | ............ H04R 1/028 |
| KR | 101704517 B1 | | 2/2017 | |

(Continued)

*Primary Examiner* — Phylesha Dabney
(74) *Attorney, Agent, or Firm* — CANTOR COLBURN LLP

(57) ABSTRACT

An electronic apparatus includes a display panel including a first surface through which an image is displayed and a second surface opposite to the first surface, a rear cover including a rear surface portion spaced apart from the display panel with an inner space interposed therebetween and a sidewall portion connected to the rear surface portion and surrounding the inner space, an exciter including a vibrator disposed in the inner space to vibrate the display panel and a supporter fixed to the rear surface portion, and a passive element outputting a sound. A reinforcement opening is defined in the sidewall portion, the exciter overlaps the reinforcement opening in a direction penetrating through the reinforcement opening, and the passive element is disposed in the reinforcement opening.

33 Claims, 29 Drawing Sheets

(56) References Cited

U.S. PATENT DOCUMENTS

| | | |
|---|---|---|
| 10,567,880 B2 | 2/2020 | Ham et al. |
| 11,019,430 B2 | 5/2021 | Ham et al. |
| 11,044,820 B2 | 6/2021 | Yu et al. |
| 2020/0186916 A1* | 6/2020 | Ham .................... H04R 1/2834 |
| 2020/0213699 A1 | 7/2020 | You et al. |
| 2020/0245059 A1 | 7/2020 | Kim et al. |
| 2020/0404213 A1* | 12/2020 | Won ........................ H04R 1/26 |
| 2021/0200264 A1 | 7/2021 | Kim et al. |
| 2021/0200504 A1* | 7/2021 | Park ...................... G06F 1/1637 |
| 2023/0209743 A1* | 6/2023 | Kim .................... H05K 5/0217 |
| | | 381/388 |

FOREIGN PATENT DOCUMENTS

| | | |
|---|---|---|
| KR | 101746496 B1 | 6/2017 |
| KR | 101780302 B1 | 9/2017 |
| KR | 101780297 B1 | 10/2017 |
| KR | 1020170115124 A | 10/2017 |
| KR | 1020170135465 A | 12/2017 |
| KR | 101817102 B1 | 1/2018 |
| KR | 101817103 B1 | 1/2018 |
| KR | 101817105 B1 | 2/2018 |
| KR | 1020200032629 A | 3/2020 |
| KR | 102201870 B1 | 1/2021 |
| KR | 1020210086124 A | 7/2021 |
| KR | 1020210086133 A | 7/2021 |

\* cited by examiner

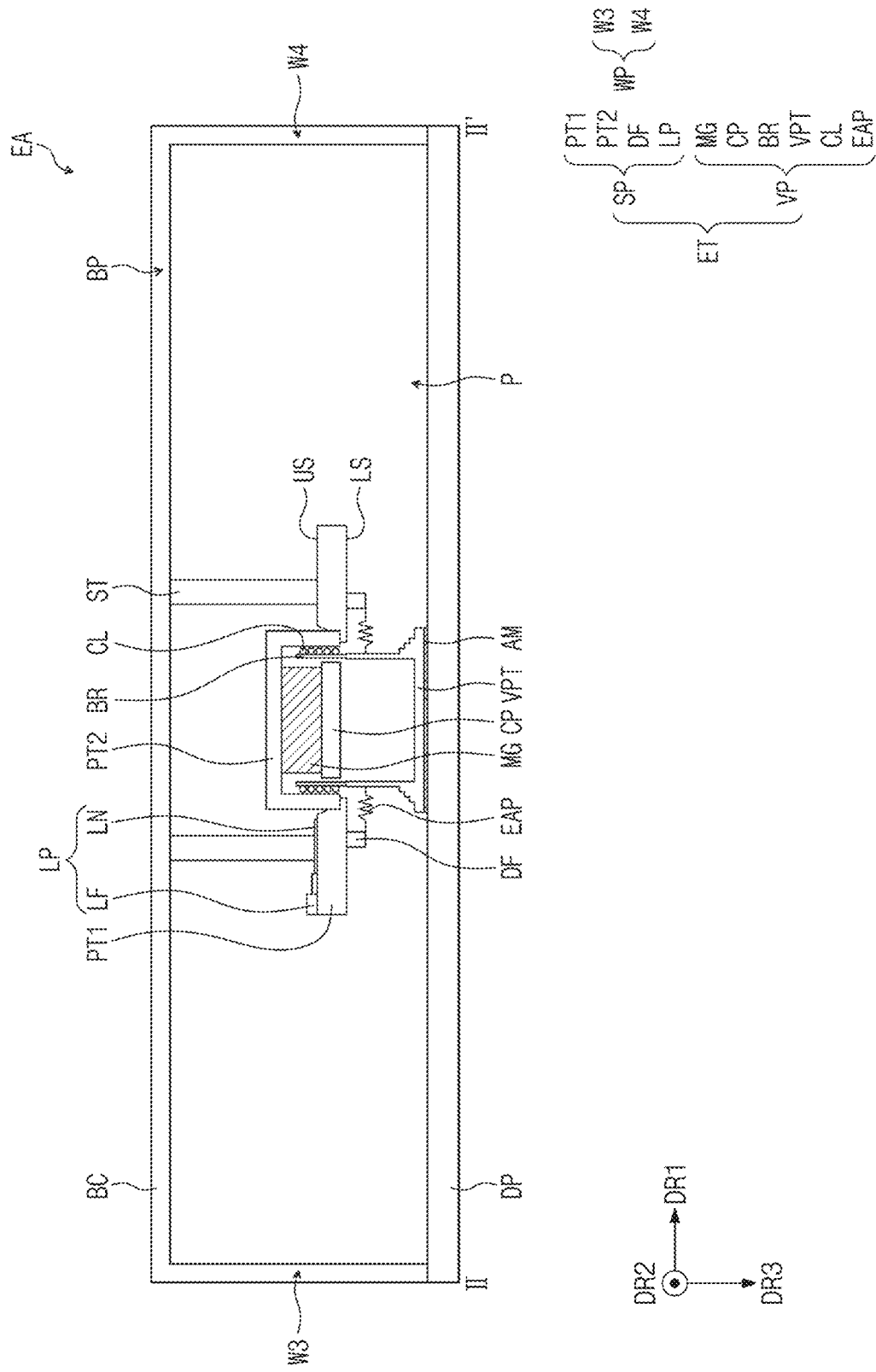

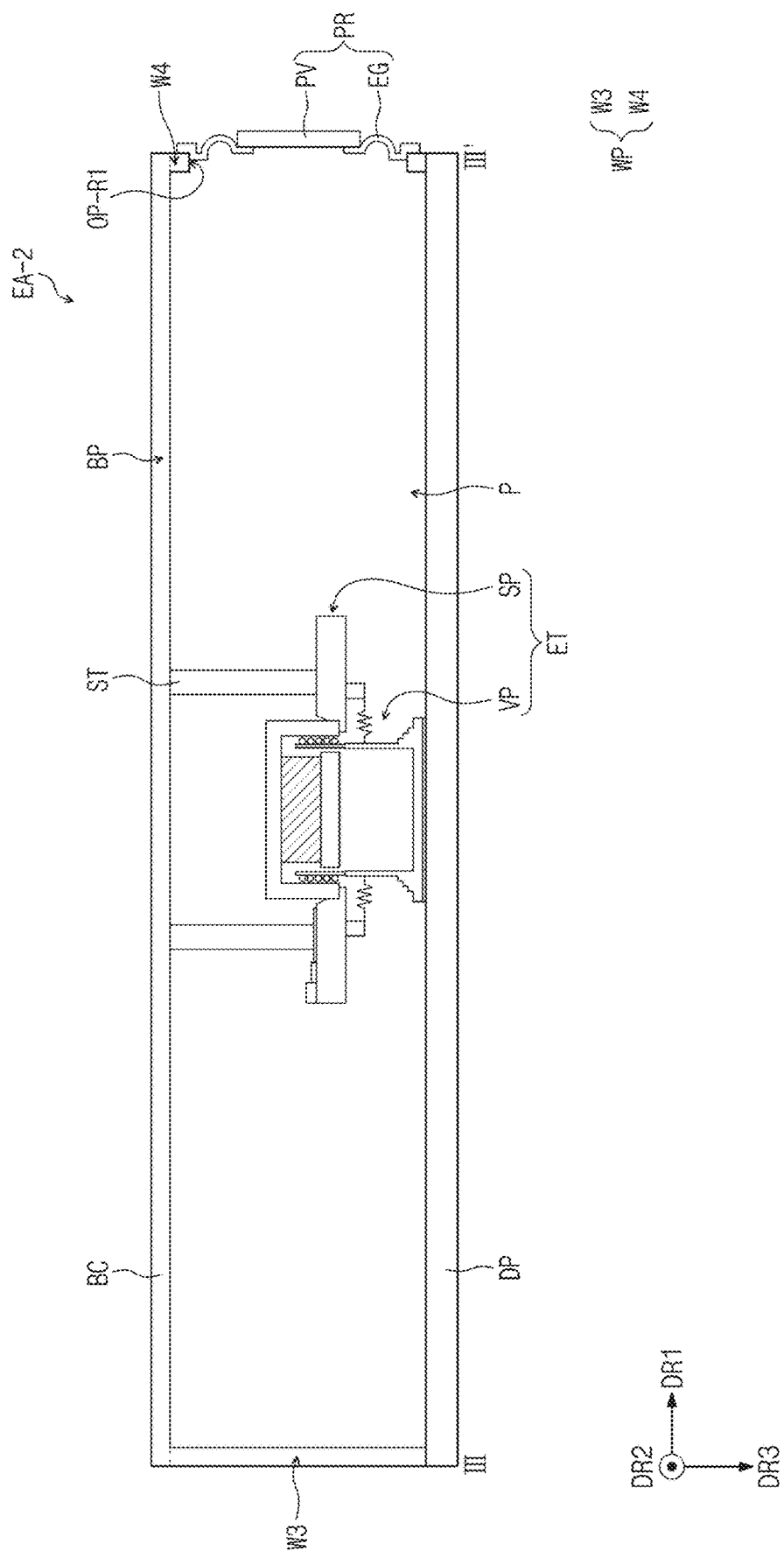

ELECTRONIC APPARATUS

This application claims priority to Korean Patent Application No. 10-2021-0191804, filed on Dec. 29, 2021, and all the benefits accruing therefrom under 35 U.S.C. § 119, the content of which in its entirety is herein incorporated by reference.

BACKGROUND

1. Field

Embodiments of the invention relate to an electronic apparatus. More particularly, embodiments of the invention relate to an electronic apparatus capable of vibrating a display panel to generate a sound.

2. Description of the Related Art

In general, an electronic apparatus that provides images includes a display panel to display the images and a separate speaker to provide a sound. When the electronic apparatus is configured as a set of equipment including the speaker, the speaker occupies a certain space, thereby causing a restriction on a design and a space arrangement for the set of equipment. A flat display panel technology in which the sound is output toward a front of the display panel through a vibration of the display panel is being developed to solve the issues described above.

SUMMARY

Embodiments of the invention provide an electronic apparatus outputting a sound in a direction to which an image is displayed and a direction (an independent direction) different from the direction to which an image is displayed to realize a three-dimensional ("3D") sound.

An embodiment of the invention provides an electronic apparatus including a display panel including a first surface through which an image is displayed and a second surface opposite to the first surface, a rear cover including a rear surface portion spaced apart from the display panel with an inner space interposed therebetween and a sidewall portion connected to the rear surface portion and surrounding the inner space, an exciter including a vibrator disposed in the inner space to vibrate the display panel and a supporter fixed to the rear surface portion, and a passive element outputting a sound. A reinforcement opening is defined through the sidewall portion, the exciter overlaps the reinforcement opening in a direction penetrating through the reinforcement opening, and the passive element is disposed in the reinforcement opening.

In an embodiment, the reinforcement opening may be adjacent to a first side edge among edges of the display panel, the passive element may output the sound to a direction from a second side edge among the edges of the display panel, which faces the first side edge, toward the first side edge, and the first side edge may be disposed above the second side edge as viewed the first surface of the display panel.

In an embodiment, the reinforcement opening may be adjacent to at least one of a third side edge among edges of the display panel and a fourth side edge among the edges of the display panel, the passive element may output the sound to at least one direction of a direction from the third side edge to the fourth side edge and a direction from the fourth side edge to the third side edge, and the third side edge and the fourth side edge may be spaced apart from each other in a horizontal direction as viewed the first surface of the display panel.

In an embodiment, the sidewall portion and the rear surface portion of the rear cover may be unitary with each other.

In an embodiment, the sidewall portion of the rear cover may include a material different from a material of the rear surface portion of the rear cover.

In an embodiment, the passive element may be a passive radiator or a duct.

In an embodiment, the passive radiator may include a passive vibrator vibrated by an air vibrating in the inner space and including a paper material or a metal material and an edge portion surrounding the passive vibrator and including a rubber.

In an embodiment, a duct opening may be defined through the duct, and the duct opening may have a circular shape, an oval shape, or an atypical shape with at least one curved side.

In an embodiment, the vibrator may include a coil to which a current is applied, a magnet of which at least a portion is surrounded by the coil, and a vibrating plate disposed on the second surface of the display panel and vibrating with respect to a thickness direction of the display panel, and the supporter may be connected to a support stick that extends in a direction from the rear surface portion of the rear cover toward the display panel.

In an embodiment, the passive element may be a passive radiator, and the inner space may be sealed by the display panel, the rear cover, and the passive radiator.

An embodiment of the invention provides an electronic apparatus including a display panel including a first surface through which an image is displayed and a second surface opposite to the first surface, a circuit board disposed on the second surface of the display panel, a first rear cover disposed between the display panel and the circuit board and including a first sidewall portion and a first rear surface portion, which define a first inner space, a plurality of barrier wall parts defining second inner spaces including a first sub-space and a second sub-space in the first inner space, a second rear cover disposed on the first rear surface portion of the first rear cover, including a second sidewall portion provided with a reinforcement opening defined therein and a second rear surface portion, which define an accommodation space in which the circuit board is accommodated, a main exciter disposed in the first sub-space and vibrating the display panel, a reinforcement exciter spaced apart from the main exciter, disposed in the second sub-space, and vibrating the display panel, a transmission part disposed in the accommodation space and defining a third inner space connecting the second sub-space and the reinforcement opening, and a passive element disposed in the reinforcement opening to output a sound. The reinforcement opening is adjacent to at least one of a first side edge, a second side edge, and a third side edge facing the second side edge of the display panel, the first side edge is disposed at an upper portion of the display panel, and the second side edge and the third side edge are disposed at both side portions of the display panel, respectively.

In an embodiment, the reinforcement exciter may be spaced apart from the main exciter in a direction penetrating through the reinforcement opening.

In an embodiment, the reinforcement exciter may be disposed above the main exciter, the transmission part may be disposed adjacent to the first side edge, and the reinforcement opening may be defined adjacent to the first side edge.

In an embodiment, the reinforcement exciter may be disposed at a side portion of the main exciter, the transmission part may be disposed adjacent to one of the second side edge and the third side edge, and the reinforcement opening may be defined adjacent to one of the second side edge and the third side edge.

In an embodiment, the circuit board may be spaced apart from the first rear cover and overlap the main exciter in a plan view.

In an embodiment, the main exciter may be provided in plural, and main exciters may include a first main exciter, a second main exciter, and a third main exciter, which are sequentially arranged in a first direction from the second side edge toward the third side edge.

In an embodiment, the circuit board may be provided in plural, circuit boards may include a first circuit board overlapping the first main exciter and a second circuit board overlapping the third main exciter, and the first circuit board and the second circuit board may be spaced apart from each other in the first direction.

In an embodiment, the first sub-space may be provided in plural, first sub-spaces may include a first space in which the first main exciter is disposed, a second space in which the second main exciter is disposed, and a third space in which the third main exciter is disposed, and the first space, the second space, and the third space may be sequentially arranged in the first direction and are spaced apart from each other.

In an embodiment, the main exciters may further include a fourth main exciter disposed under the second main exciter.

In an embodiment, the first sub-spaces may further include a fourth space accommodating the fourth main exciter, a length of the fourth space in the first direction may be greater than a length of the second space in the first direction, and a length of the fourth space in a second direction crossing the first direction may be smaller than a length of the second space in the second direction.

In an embodiment, a sound output from the fourth main excitor may have a frequency lower than a frequency of a sound output from each of the first main exciter, the second main exciter, and the third main exciter.

In an embodiment, each of the reinforcement exciter, the transmission part, and the reinforcement opening may be provided in plural, reinforcement exciters may include a first reinforcement exciter and a second reinforcement exciter spaced apart from the first reinforcement exciter in a first direction toward the third side edge from the second side edge, transmission parts may include a first transmission part and a second transmission part spaced apart from the first transmission part in the first direction, and reinforcement openings may include a first reinforcement opening and a second reinforcement opening spaced apart from the first reinforcement opening in the first direction.

In an embodiment, each of the first reinforcement exciter and the second reinforcement exciter may be disposed above the main exciter, and each of the first reinforcement opening and the second reinforcement opening may be defined adjacent to the first side edge.

In an embodiment, the first reinforcement exciter may be disposed at a left side of the main exciter, the second reinforcement exciter may be disposed at a right side of the main exciter, the first reinforcement opening may be defined adjacent to the second side edge, and the second reinforcement opening may be defined adjacent to the third side edge.

In an embodiment, each of the first reinforcement exciter and the second reinforcement exciter may be provided in plural, first reinforcement exciters may be respectively disposed at an upper side of the main exciter and at a left side of the main exciter, and second reinforcement exciters may be respectively disposed at the upper side of the main exciter and at a right side of the main exciter.

In an embodiment, the first rear cover further may include a first support stick extending in a direction toward the second rear surface portion of the second rear cover from the first rear surface portion of the first rear cover, and the main exciter may include a first vibrator vibrating the display panel and a first supporter supporting the first vibrator, disposed on the first rear surface portion of the first rear cover, and connected to the first support stick.

In an embodiment, a first cover opening may be defined through the first rear surface portion of the first rear cover, an inner side surface of the first rear cover, which defines the first cover opening, may be aligned with a barrier wall part dividing the second sub-space among the barrier wall parts, and the transmission part may include a third sidewall portion and a third rear surface portion, which are disposed on the first rear cover, covering the first cover opening, and defining the third inner space.

In an embodiment, a sub-reinforcement opening may be defined through the third sidewall portion of the transmission part, the sub-reinforcement opening may be disposed in the reinforcement opening, and the passive element may be disposed in the sub-reinforcement opening.

In an embodiment, the transmission part further may include a second support stick extending in a direction toward the display panel from the third rear surface portion, and the reinforcement exciter may include a second vibrator vibrating the display panel and a second supporter supporting the second vibrator and connected to the second support stick.

In an embodiment, the first rear surface portion of the first rear cover may be provided with a second cover opening, a barrier wall part dividing the second sub-space among the barrier wall parts may surround the second cover opening in a plan view, a first end of the transmission part may be disposed in the second cover opening, and a second end of the transmission part may be disposed in the reinforcement opening.

In an embodiment, the first rear cover may further include a first support stick extending in a direction from the first rear surface portion of the first rear cover toward the second rear surface portion of the second rear cover, and the reinforcement exciter may include a second vibrator vibrating the display panel and a second supporter supporting the second vibrator, disposed on the first rear surface portion of the first rear cover, and connected to the first support stick.

In an embodiment, the passive element may be a passive radiator or a duct.

In an embodiment, the passive element may be a passive radiator, and the second sub-space and the third inner space extending to or from the second sub-space may be sealed by the first rear cover, a barrier wall part defining the second sub-space among the barrier wall parts, the transmission part, and the passive radiator.

According to the above, the passive element is disposed at one side of the electronic apparatus, and the sound is output to the direction (the independent direction) that is different from the direction to which an image is displayed in the electronic apparatus. Accordingly, the electronic apparatus implements a 3D sound without employing a separate speaker unit.

BRIEF DESCRIPTION OF THE DRAWINGS

The above and other advantages of the invention will become readily apparent by reference to the following detailed description when considered in conjunction with the accompanying drawings, in which:

FIG. 3B is a cross-sectional view of an embodiment of an electronic apparatus taken along line II-II' of FIG. 1 according to the invention;

FIG. 8A is a cross-sectional view of an embodiment of an electronic apparatus taken along line III-III' of FIG. 7 according to the invention;

DETAILED DESCRIPTION

Figure 1:
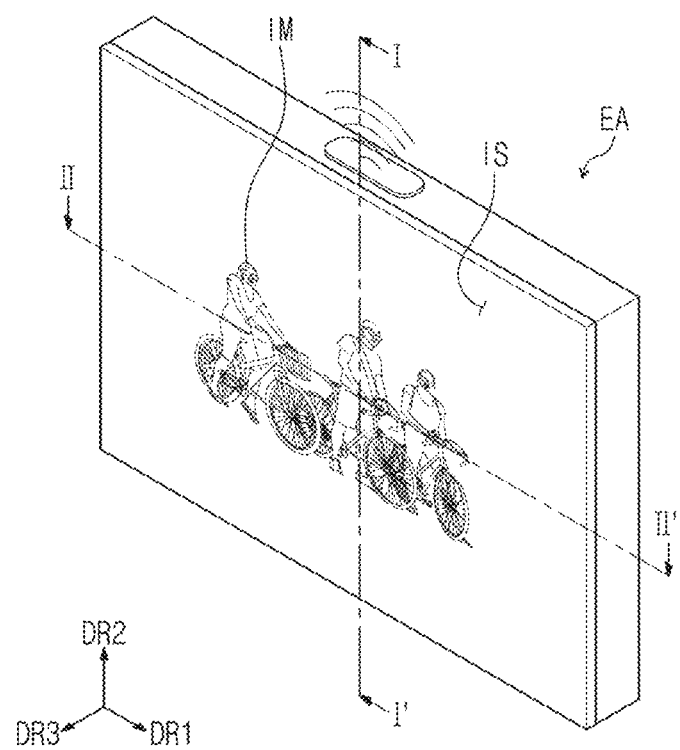
FIG. 1 is a perspective view of an embodiment of an electronic apparatus according to the invention.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the drawing figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to accompanying drawings.

Figure 2:
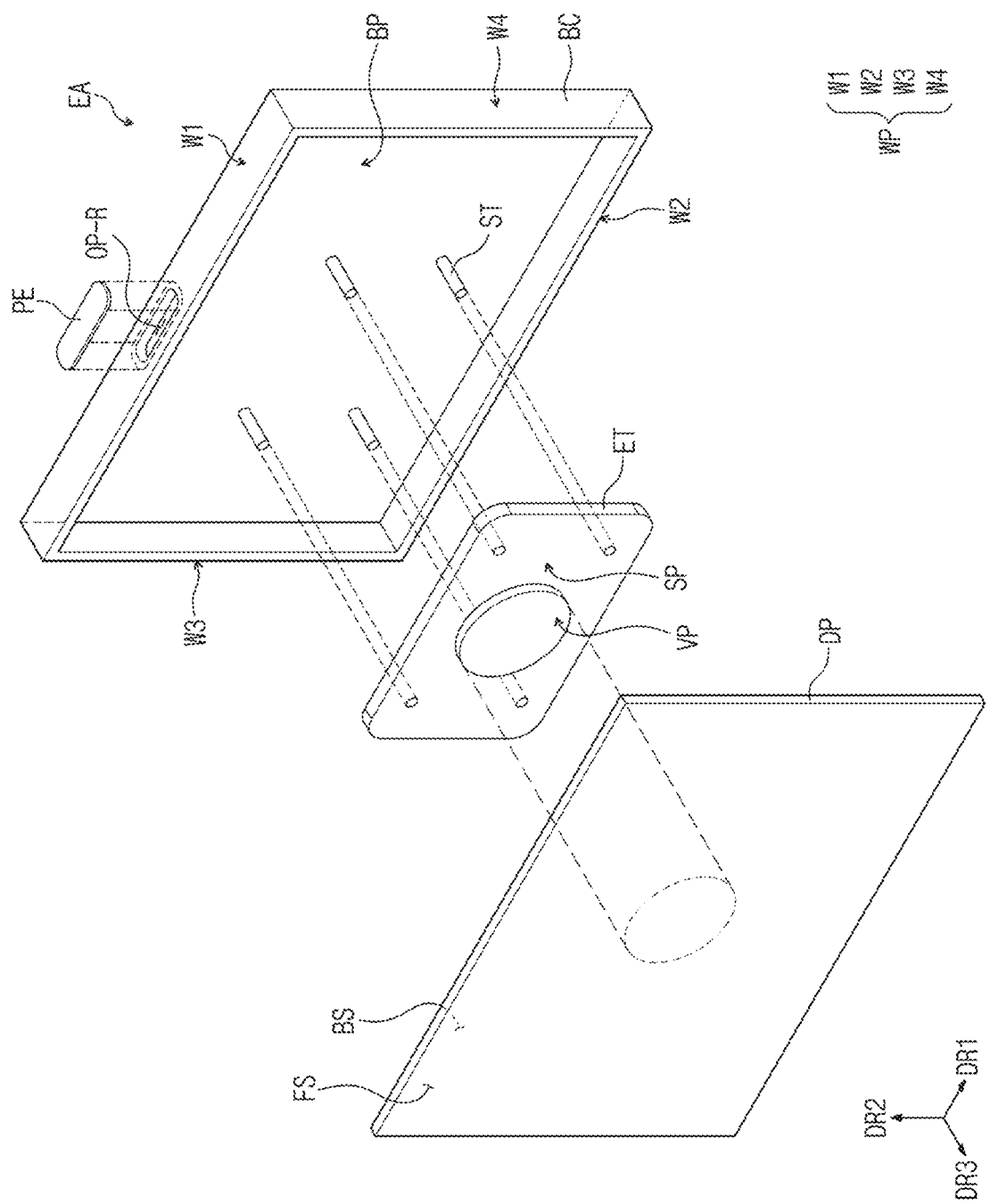
FIG. 2 is an exploded perspective view of an embodiment of an electronic apparatus according to the invention.

FIG. 1 is a perspective view of an embodiment of an electronic apparatus EA according to the invention. FIG. 2 is an exploded perspective view of an embodiment of the electronic apparatus EA according to the invention.

Referring to FIG. 1, the electronic apparatus EA may be a module that is activated in response to electrical signals and displays an image.

The electronic apparatus EA may display an image IM through a display surface IS that is substantially parallel to each of a first direction DR1 and a second direction DR2 toward a third direction DR3. The display surface IS through which the image IM is displayed may correspond to a front surface of the electronic apparatus EA. The image IM may include a video and a still image.

In the illustrated embodiment, front (or upper) and rear (or lower) surfaces of each member of the electronic apparatus EA may be defined with respect to the third direction DR3 in which the image IM is displayed. The front and rear surfaces may be opposite to each other in the third direction DR3, and a normal line direction of each of the front and rear surfaces may be substantially parallel to the third direction DR3.

A separation distance between the front surface and the rear surface in the third direction DR3 may correspond to a thickness in the third direction DR3 of the electronic apparatus EA. Directions indicated by the first, second, and third directions DR1, DR2, and DR3 may be relative to each other and may be changed to other directions.

The electronic apparatus EA may have a quadrangular (e.g., rectangular) shape with long sides extending in the first direction DR1 and short sides extending in the second direction DR2 in a plan view, however, the shape of the electronic apparatus EA should not be limited thereto or thereby. In an embodiment, the electronic apparatus EA may have a variety of shapes, such as a circular shape, a polygonal shape, etc.

In an embodiment of the invention, the electronic apparatus EA may emit a sound in the third direction DR3, i.e., toward a front of the display surface IS. In addition, the electronic apparatus EA in the illustrated embodiment may emit the sound in the second direction DR2, i.e., an upward direction of the electronic apparatus EA.

Referring to FIG. 2, the electronic apparatus EA may include a display panel DP, a rear cover BC, an exciter ET, a support stick ST, and a passive element PE.

The display panel DP may have a configuration that substantially generates an image. The display panel DP may be one of an organic light-emitting display panel, an inorganic light-emitting display panel, and a quantum-dot display panel, however, it should not be particularly limited.

The display panel DP may include a first surface FS through which the image is displayed and a second surface BS opposite to the first surface FS. The first surface FS of the display panel DP may correspond to the display surface IS described with reference to FIG. 1. That is, the first surface FS of the display panel DP may display the image IM (refer to FIG. 1), however, this is merely one of embodiments. In an embodiment, the display panel DP may also display the image through the second surface BS, and in this case, the display surface IS may correspond to the second surface BS. That is, a position of the display surface IS should not be particularly limited as long as the display panel DP includes the display surface IS through which the image IM is displayed.

In an embodiment, the display panel DP may have a quadrangular (e.g., rectangular) shape with long sides extending in the first direction DR1 and short sides extending in the second direction DR2 in a plan view, however, the shape of the display panel DP should not be limited thereto or thereby. In an embodiment, the display panel DP may have a variety of shapes depending on the shape and the type of the electronic apparatus EA.

The rear cover BC may cover the second surface BS of the display panel DP. In the illustrated embodiment, the rear cover BC may include a rear surface portion BP and a sidewall portion WP. The rear surface portion BP and the sidewall portion WP may provide a predetermined inner space P (refer to FIG. 3A) with the second surface BS of the display panel DP.

The rear surface portion BP may face the second surface BS of the display panel DP. The rear surface portion BP may be spaced apart from the display panel DP with the inner space P (refer to FIG. 3A) interposed therebetween.

The rear surface portion BP may have a quadrangular (e.g., rectangular) shape with long sides extending in the first direction DR1 and short sides extending in the second direction DR2 in a plan view, however, the shape of the rear surface portion BP should not be limited thereto or thereby. In an embodiment, the rear surface portion BP may have a variety of shapes according to the shape of the display panel DP.

The sidewall portion WP may be bent from the rear surface portion BP along the third direction DR3. The sidewall portion WP may include a first sidewall W1 extending in the first direction DR1, a second sidewall W2 extending in the first direction DR1 and facing the first sidewall W1 in the second direction DR2, a third sidewall W3 extending in the second direction DR2, and a fourth sidewall W4 extending in the second direction DR2 and facing the third sidewall W3 in the first direction DR1.

The first sidewall W1 may be disposed along and aligned with a first side edge of the display panel DP. The second sidewall W2 may be disposed along and aligned with a second side edge facing the first side edge of the display panel DP.

The third sidewall W3 may be disposed along and aligned with a third side edge of the display panel DP. The fourth sidewall W4 may be disposed along and aligned with a fourth side edge facing the third side edge of the display panel DP.

In the illustrated embodiment, based on a plane viewed in a direction facing the first surface FS of the display panel DP, a first side may correspond to an upper side of the display panel DP, and a second side may correspond to a lower side of the display panel DP. That is, the first side edge and the second side edge may be spaced apart from each other in a vertical direction. In addition, based on the plane viewed from the first surface FS of the display panel DP, a third side may correspond to a left side of the display panel DP, and a fourth side may correspond to a right side of the display panel DP. That is, the third side edge and the fourth side edge may be spaced apart from each other in a horizontal direction.

Hereinafter, in embodiments described with reference to FIGS. 3A to 10B, the first, second, third, and fourth sides will be described as the upper side, the lower side, the left side, and the right side, respectively, based on the plane in the direction facing the first surface FS of the display panel DP.

In an embodiment of the invention, a predetermined reinforcement opening OP-R may be defined through the sidewall portion WP. In the illustrated embodiment, the reinforcement opening OP-R may be defined through the first sidewall W1 of the sidewall portion WP. The reinforcement opening OP-R may be defined through the first sidewall W1 in a direction toward the first side edge from the second side edge of the display panel DP, i.e., the second direction DR2.

The exciter ET and the support stick ST may be disposed in the inner space P.

The exciter ET may be disposed in the inner space P surrounded by the display panel DP and the rear cover BC. The exciter ET may be an element that causes a vibration in response to an electrical signal. In the illustrated embodiment, the exciter ET may include a vibrator VP and a supporter SP.

The vibrator VP may be disposed on the second surface BS of the display panel DP. The vibrator VP may output the vibration corresponding to an input signal. The vibrator VP may be electrically connected to an image board and may receive the input signal corresponding to a sound signal of an image. The vibrator VP may contact the display panel DP and may vibrate the display panel DP, and thus, a sound corresponding to the image of the electronic apparatus EA may be emitted forward. This will be described in detail later.

The supporter SP may be connected to the support stick ST and may be fixed to the rear surface portion BP of the rear cover BC. In this case, the supporter SP may be connected to the support stick ST by a separate fastening member. In an embodiment, the fastening member may include a nut and a screw.

The support stick ST may be accommodated in the inner space P. The support stick ST may be disposed between the exciter ET and the rear surface portion BP and may be coupled to the exciter ET and the rear surface portion BP.

In the illustrated embodiment, the support stick ST may be provided in plural, and each of the support sticks ST may have a circular shape in a cross-section thereof and may have a stick shape extending in the third direction DR3. However, the shape of the support stick ST should not be particularly limited. In an embodiment, the support stick ST may have an oval shape or a polygonal shape in a cross-section thereof.

The support stick ST may be a separate component attached to the rear surface portion BP of the rear cover BC by a separate adhesive member, however, it should not be limited thereto or thereby. In an embodiment, the support stick ST may be unitary with the rear surface portion BP of the rear cover BC.

The passive element PE may be disposed in the sidewall portion WP of the rear cover BC. The passive element PE may be disposed in the reinforcement opening OP-R defined through the sidewall portion WP of the rear cover BC. In the illustrated embodiment, the passive element PE may be disposed in the reinforcement opening OP-R defined through the first sidewall W1.

Figure 5A:
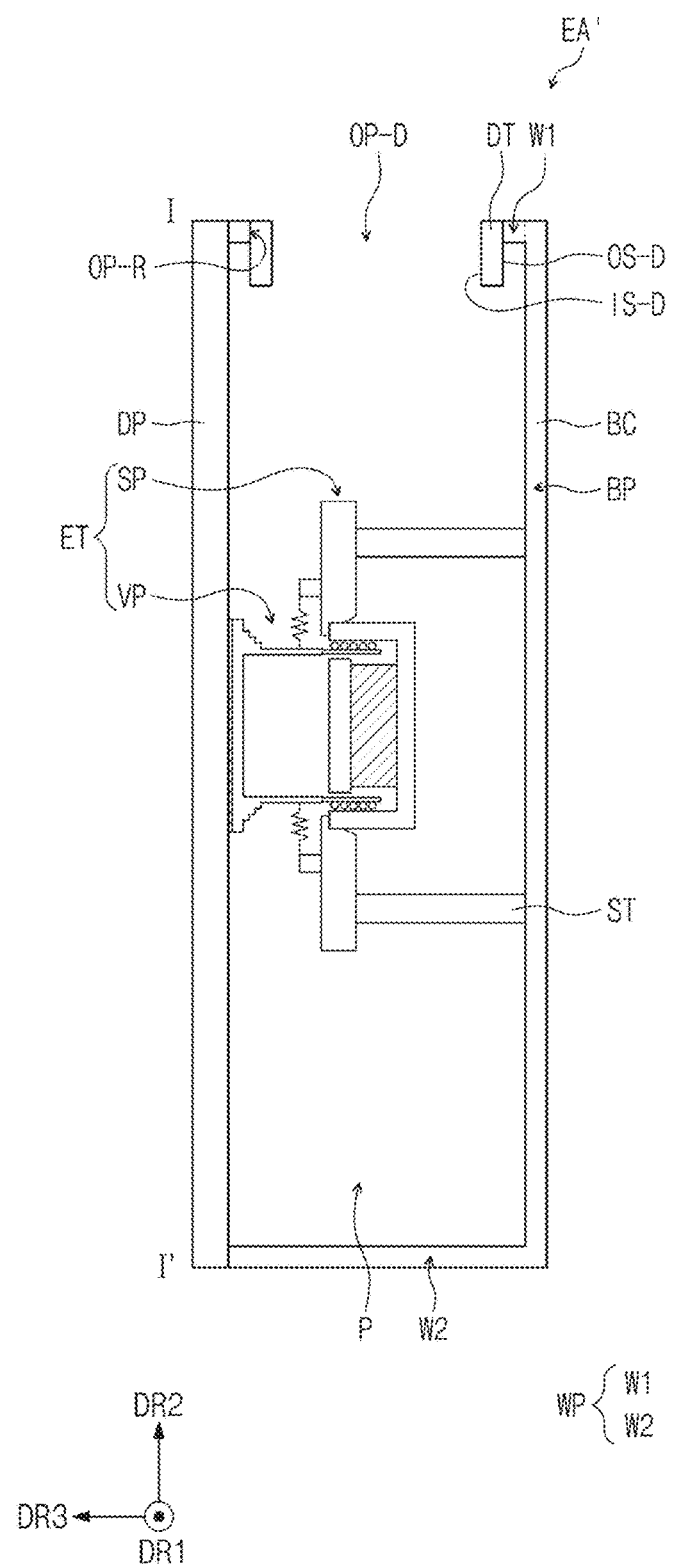
FIG. 5A is a cross-sectional view of an embodiment of an electronic apparatus taken along line I-I' of FIG. 1 according to the invention.

The passive element PE may be a passive radiator PR (refer to FIG. 3C) or a duct DT (refer to FIG. 5A). This will be described in detail later. FIG. 2 shows the passive radiator PR as the passive element PE.

In the invention, the passive element PE may reinforce the sound corresponding to a low frequency of the output sound. Accordingly, the electronic apparatus EA may output the sound reinforced in the low range. The passive element PE may output the sound from the inner space P of the electronic apparatus EA to the outside of the electronic apparatus EA, i.e., in a direction passing the reinforcement opening OP-R. In the illustrated embodiment, the passive element PE may output the sound from the electronic apparatus EA to the upward direction, i.e., the second direction DR2.

Figure 3A:
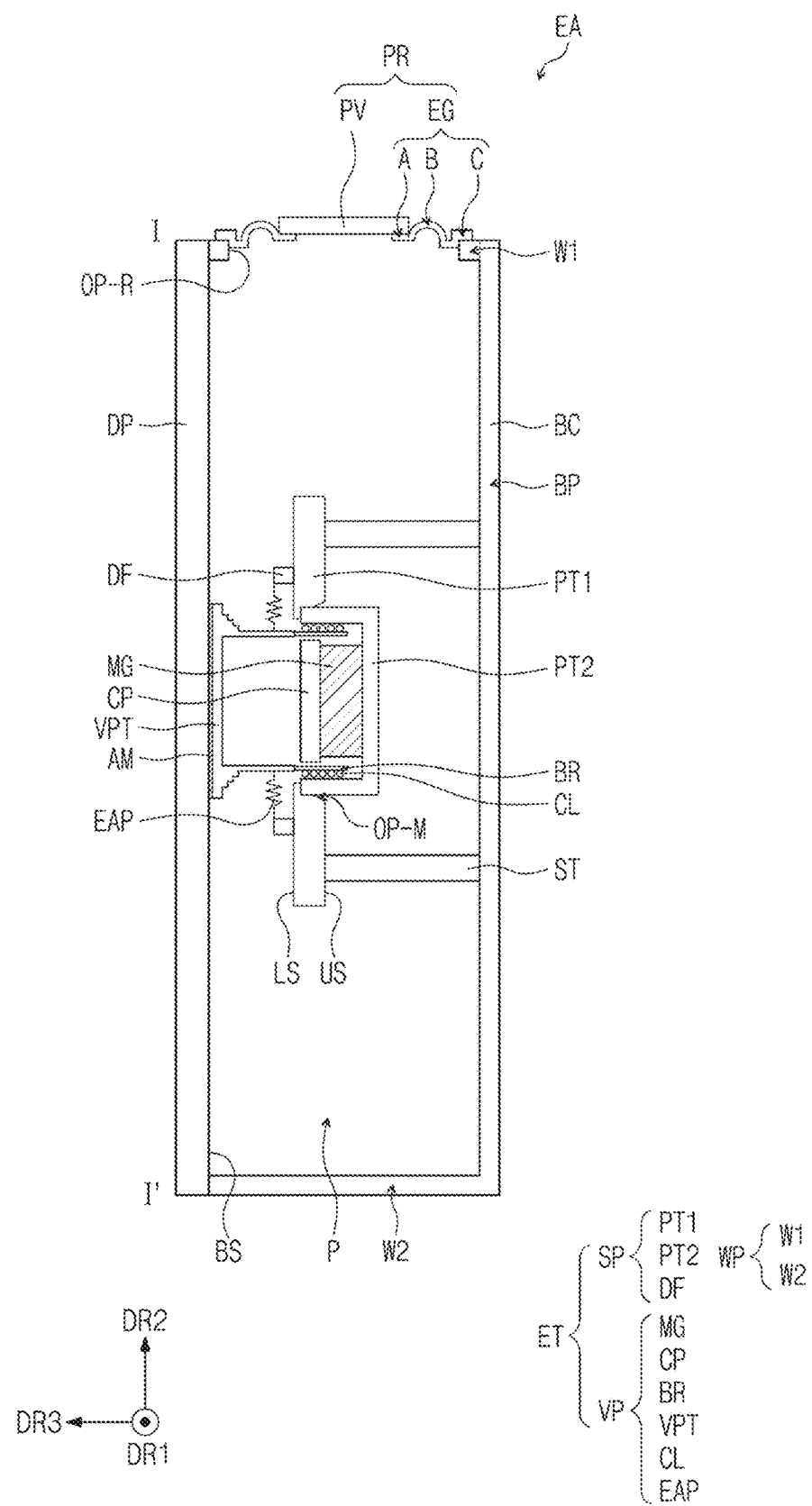
FIG. 3A is a cross-sectional view of an embodiment of an electronic apparatus taken along line I-I' of FIG. 1 according to the invention.
Figure 3C:
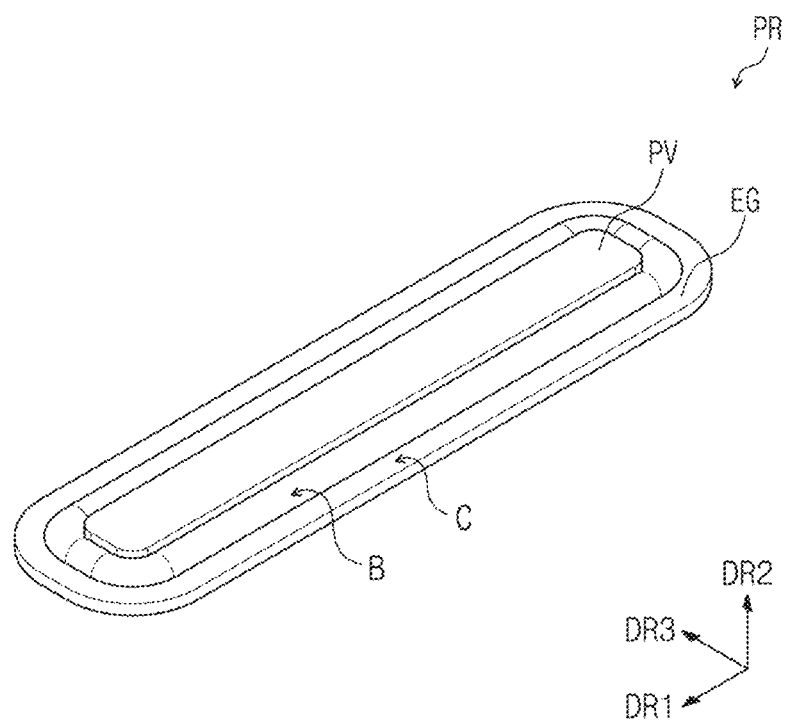
FIG. 3C is a perspective view of an embodiment of a passive element according to the invention.
Figure 4A:
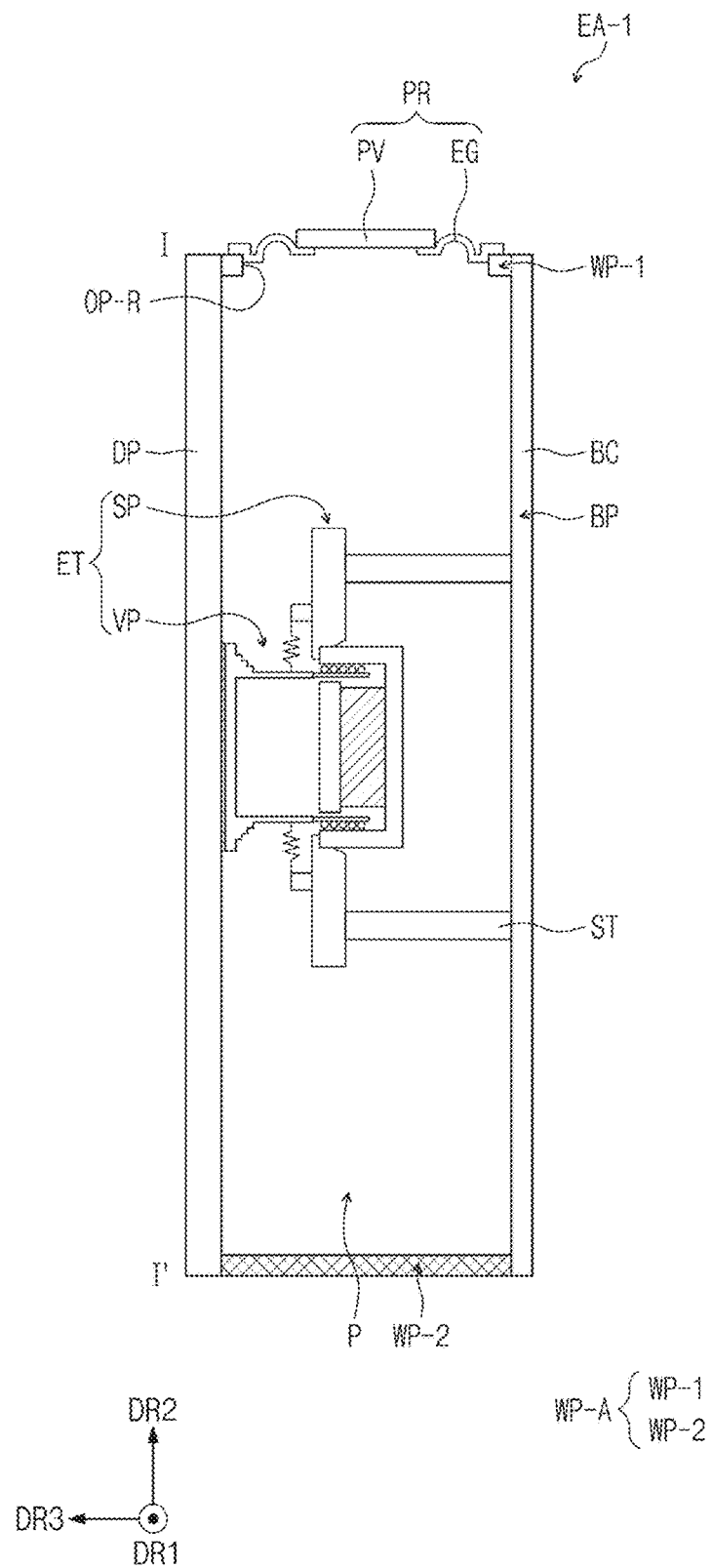
FIG. 4A is a cross-sectional view of an embodiment of an electronic apparatus taken along line I-I' of FIG. 1 according to the invention.
Figure 4B:
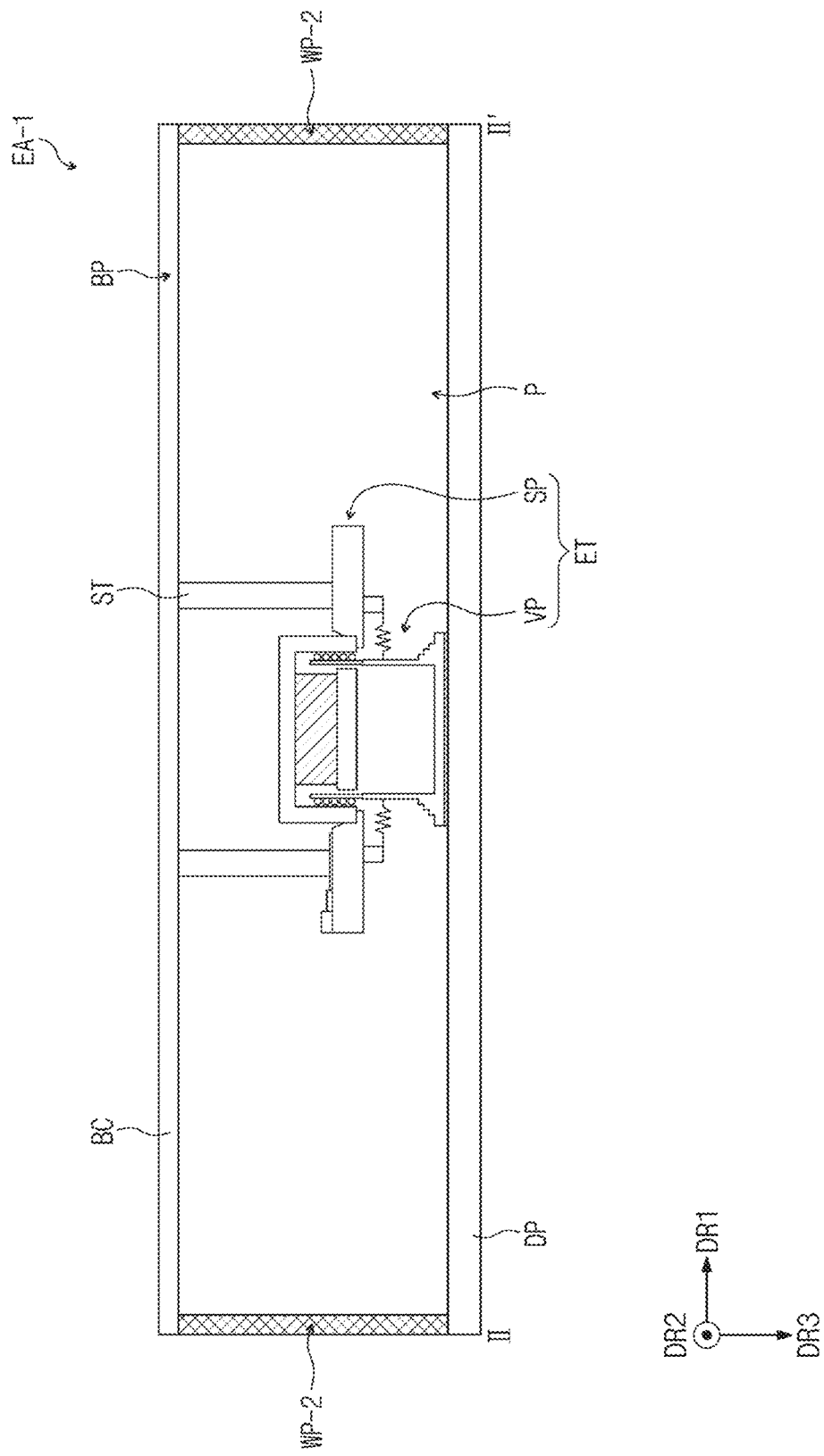
FIG. 4B is a cross-sectional view of an electronic apparatus taken along line II-II' of FIG. 1 according to the invention.

FIG. 3A is a cross-sectional view of an embodiment of the electronic apparatus EA taken along line I-I' of FIG. 1 according to the invention. FIG. 3B is a cross-sectional view of an embodiment of the electronic apparatus EA taken along line II-II' of FIG. 1 according to the invention. FIG. 3C is a perspective view of an embodiment of the passive radiator PR according to the invention. FIG. 4A is a cross-sectional view of an embodiment of an electronic apparatus EA-1 taken along line I-I' of FIG. 1 according to the invention. FIG. 4B is a cross-sectional view of an embodiment of the electronic apparatus EA-1 taken along line II-II' of FIG. 1 according to the invention.

Referring to FIGS. 3A and 3B, the electronic apparatus EA may include the display panel DP, the rear cover BC, the exciter ET, the support stick ST, and the passive radiator PR. In FIGS. 3A and 3B, the same/similar reference numerals denote the same/similar elements in FIGS. 1 and 2, and thus, detailed descriptions of the same/similar elements will be omitted.

In the illustrated embodiment, the rear surface portion BP and the sidewall portion WP of the rear cover BC may be unitary with each other. The rear surface portion BP and the sidewall portion WP of the rear cover BC may include the same material as each other. In an embodiment, the rear surface portion BP and the sidewall portion WP of the rear cover BC may include a metal material.

The exciter ET may be disposed in the inner space P. In the illustrated embodiment, the exciter ET may overlap the reinforcement opening OP-R when viewed in a direction passing through the reinforcement opening OP-R, i.e., the second direction DR2.

The exciter ET may include the supporter SP and the vibrator VP.

The supporter SP may include a first support plate PT1, a second support plate PT2, a damper fixing part DF, and a line part LP.

The first support plate PT1 may be disposed between the second surface BS of the display panel DP and the rear surface portion BP of the rear cover BC. The first support plate PT1 may include a lower surface LS facing the second surface BS of the display panel DP and an upper surface US opposite to the lower surface LS and facing the rear surface portion BP of the rear cover BC. The upper surface US of the first support plate PT1 may be connected to the support stick ST. A center opening OP-M may be defined through a center of the first support plate PT1.

The second support plate PT2 may be disposed in the center opening OP-M defined through the first support plate PT1. The second support plate PT2 may be fixed to an inner side surface that defines the center opening OP-M of the first support plate PT1.

The second support plate PT2 may have a cylindrical shape provided with an accommodation space defined therein. The second support plate PT2 may have a circular shape in the plane when viewed in the third direction DR3, however, the shape of the second support plate PT2 should not be limited thereto or thereby.

The damper fixing part DF may be disposed on the lower surface LS of the first support plate PT1, however, it should not be limited thereto or thereby. In an embodiment, the damper fixing part DF may be unitary with the first support plate PT1 and may protrude from the lower surface LS of the first support plate PT1.

Referring to FIG. 3B, the line part LP may include a line fixing part LF and lines LN.

The line fixing part LF may be disposed on the upper surface US of the first support plate PT1. The line fixing part LF may fix the lines LN. The lines LN may be connected to one end and the other end of a coil CL described later to form a closed loop. Some of the lines LN may be disposed penetrating through the first support plate PT1 and the second support plate PT2.

The vibrator VP may include a magnet MG, a center pole CP, a bobbin ring BR, a vibrating plate VPT, the coil CL, and a damper EAP. The vibrator VP may be disposed on the second surface BS of the display panel DP after passing through the center opening OP-M defined through the first support plate PT1.

The magnet MG may be disposed in the accommodation space of the second support plate PT2. The magnet MG may be attached and fixed to an inner surface of the second support plate PT2.

The center pole CP may be disposed in the accommodation space of the second support plate PT2. The center pole CP may be disposed on the magnet MG and may fix the magnet MG. The center pole CP may collect a magnetic field generated around the magnet MG.

The bobbin ring BR may surround the center pole CP and a portion of the magnet MG. The bobbin ring BR may have a configuration in which the coil CL is wound on an outer circumferential surface.

The vibrating plate VPT may be disposed on the second surface BS of the display panel DP. The vibrating plate VPT may be attached to the second surface BS of the display panel DP by an adhesive member AM. One end of the vibrating plate VPT may be connected to one end of the bobbin ring BR. Accordingly, the vibrating plate VPT may transmit the vibration of the bobbin ring BR to the display panel DP.

The coil CL may surround the bobbin ring BR. The coil CL may receive a current for a generation of the sound (hereinafter, also referred to as a sound generating current). When the sound generating current is applied to the coil CL, the magnetic field may be generated around the coil CL. A magnetic flux generated by the magnetic field may flow along a closed loop generated between the coil CL, the center pole CP, the magnet MG, and the coil CL. Accordingly, the coil CL may vibrate according to Fleming's left hand rule based on an applied magnetic field generated around the coil CL and an external magnetic field generated around the magnet MG. The vibration may be transmitted to the vibrating plate VPT connected to the bobbin ring BR and may vibrate the display panel DP.

The damper EAP may be connected between the vibrating plate VPT and the lower surface LS of the first support plate PT1 and may guide the vibration of the bobbin ring BR. The damper EAP may have a corrugated structure between one end and the other end thereof, and thus, the damper EAP may control and guide the vibration of the bobbin ring BR while being pressed and returning to its original shape according to the vibration of the bobbin ring BR. In this case, the damper EAP may restrict a vibration distance of the bobbin ring BR using a restoring force thereof.

As the exciter ET directly vibrates the display panel DP, the sound may be output to the front of the display panel DP. Accordingly, a position where the image of the electronic apparatus EA is displayed and a position where the sound is generated may match with each other, and thus, an immersion of a viewer who watches the image of the electronic apparatus EA may be improved.

In the illustrated embodiment, the passive element PE may be the passive radiator PR. Referring to FIGS. 3A and 3C, the passive radiator PR may include a passive vibrator PV and an edge portion EG.

In an embodiment, the passive vibrator PV may be a plate having a quadrangular (e.g., rectangular) shape with rounded edges on a plane viewed from the second direction DR2. The passive vibrator PV may include long sides extending in the first direction DR1 and short sides extending in the second direction DR2 in the plane. Edges connecting a long side and a short side, which are adjacent to each other, among the long sides and the short sides may have a predetermined curvature. In addition, the shape of the passive vibrator PV may be changed in various ways and should not be particularly limited. In an embodiment, the passive vibrator PV may include one of paper and metal materials.

The edge portion EG may surround the passive vibrator PV. The edge portion EG may include a first support area A, a protrusion area B, and a second support area C.

The first support area A may be disposed under the passive vibrator PV and may support the passive vibrator PV as shown in FIG. 3A. The protrusion area B may have a predetermined curvature and may protrude to the second direction DR2. The protrusion area B may surround the passive vibrator PV.

At least a portion of the second support area C may be inserted into the reinforcement opening OP-R. An end of the second support area C may be attached to the sidewall portion WP. In addition, the second support area C may cover a portion of an inner side surface of the sidewall portion WP that defines the reinforcement opening OP-R.

Accordingly, the passive radiator PR may be disposed in the reinforcement opening OP-R and may be supported by the second support area C in the reinforcement opening OP-R. The passive radiator PR may seal the inner space defined by the display panel DP and the rear cover BC.

However, the shape of the second support area C may be changed in various ways and should not be particularly limited as long as the passive radiator PR may be fixed to be disposed in the reinforcement opening OP-R.

In addition, the shape of the edge portion EG may be changed in various ways and should not be particularly limited. In an embodiment, the passive radiator PR may further include other components rather than the edge portion EG, or the edge portion EG may be omitted.

As the passive vibrator PV vibrates, the edge portion EG may also vibrate. The edge portion EG may include a rubber.

As shown in FIG. 3A, the passive radiator PR may overlap the exciter ET when viewed in the direction passing through the reinforcement opening OP-R, i.e., in the second direction DR2.

In the illustrated embodiment, the inner space P may be surrounded and sealed by the display panel DP, the rear cover BC, and the passive radiator PR.

In an embodiment of the invention, an air in the inner space P may vibrate by the display panel DP vibrating by the exciter ET, and the vibrating air may be transmitted to the passive vibrator PV. In this case, the passive vibrator PV may resonate with the vibrating air, and thus, the sound reinforced in the low range may be output to the outside of the electronic apparatus EA. The passive radiator PR may output the sound even though the sound generating current is not applied to the passive radiator PR. A frequency of the sound output from the passive vibrator PV may be controlled by varying a mass and a rigidity of the passive vibrator PV.

As the passive vibrator PV of the passive radiator PR vibrates with respect to the second direction DR2, the sound may be output to a direction from the second side edge of the display panel DP to the first side edge of the display panel DP, e.g., a direction (hereinafter, also referred to as an upward direction) from a lower side edge to an upper side edge.

In an embodiment of the invention, the sound may be output to the upward direction of the electronic apparatus EA by the passive radiator PR, and the sound output to the upward direction may be reflected by a ceiling and travel toward a head of the viewer watching the image of the electronic apparatus EA. Accordingly, the electronic apparatus EA may implement an overhead sound and more three-dimensional ("3D") sound. That is, the electronic apparatus EA may implement Dolby Atmos®.

In an embodiment of the invention, since the electronic apparatus EA implements the overhead sound, the electronic apparatus EA may implement the 3D sound even though a separate speaker unit, which implements the overhead sound, is not provided to the electronic apparatus EA. Accordingly, as the separate speaker unit is not attached to the second surface BS of the electronic apparatus EA, a thickness of an apparatus to which the electronic apparatus EA is applied may be reduced. In addition, as the separate speaker unit is not desired, it is possible to provide the electronic apparatus EA that implements the 3D sound even to a place with space constraint.

Referring to FIGS. 4A and 4B, the electronic apparatus EA-1 may include a display panel DP, a rear cover BC, an exciter ET, a support stick ST, and a passive radiator PR. In FIGS. 4A and 4B, the same/similar reference numerals denote the same/similar elements in FIGS. 1 to 3C, and thus, detailed descriptions of the same/similar elements will be omitted.

In the illustrated embodiment, different from FIGS. 3A and 3B, a sidewall portion WP-A of the rear cover BC may include a first portion WP-1 and a second portion WP-2, and first portion WP-1 may include a material different from a material of the second portion WP-2.

The first portion WP-1 of the sidewall portion WP-A may correspond to a sidewall through which a reinforcement opening OP-R is defined among first, second, third, and fourth sidewalls W1, W2, W3, and W4 (refer to FIG. 2). In the illustrated embodiment, the first portion WP-1 of the sidewall portion WP-A may correspond to the first sidewall W1 (refer to FIG. 2). The first portion WP-1 may be unitary with a rear surface portion BP of the rear cover BC. The rear surface portion BP of the rear cover BC and the first portion WP-1 of the sidewall portion WP-A may include a metal material. The first portion WP-1 may include a material with high rigidity, and thus, the first portion WP-1 may support the passive radiator PR.

The second portion WP-2 of the sidewall portion WP-A may correspond to the other sidewalls among the first, second, third, and fourth sidewalls W1, W2, W3, and W4 except the sidewall through which the reinforcement opening OP-R is defined. In the illustrated embodiment, the second portion WP-2 of the sidewall portion WP-A may correspond to the second, third, and fourth sidewalls W2, W3, and W4 (refer to FIG. 2). The second portion WP-2 may include an adhesive material. In an embodiment, the second portion WP-2 may be a double-sided tape, however, it should not be limited thereto or thereby. In an embodiment, the second portion WP-2 may include a sealing member or an elastic member.

The second portion WP-2 may include a material with a relatively lower rigidity than that of the first portion WP-1, and thus the second portion WP-2 may absorb the vibration of the display panel DP. Accordingly, the electronic apparatus EA-1 may be prevented from being damaged due to the vibration of the display panel DP.

Figure 5B:
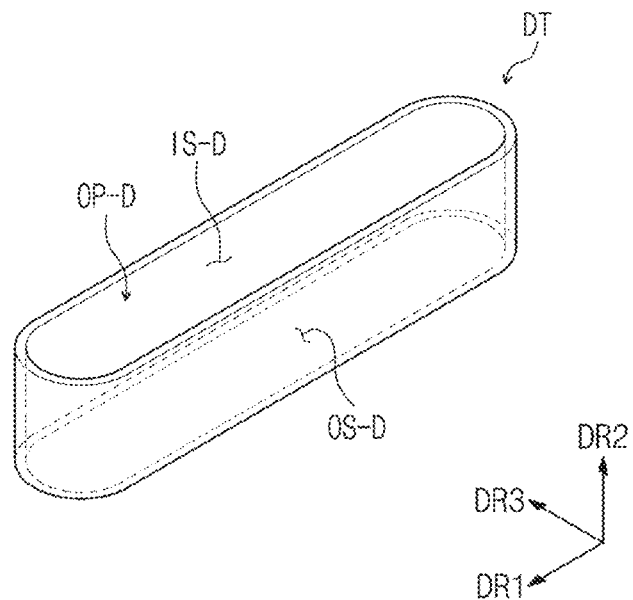
FIG. 5B is a perspective view of an embodiment of a passive element according to the invention.
Figure 5C:
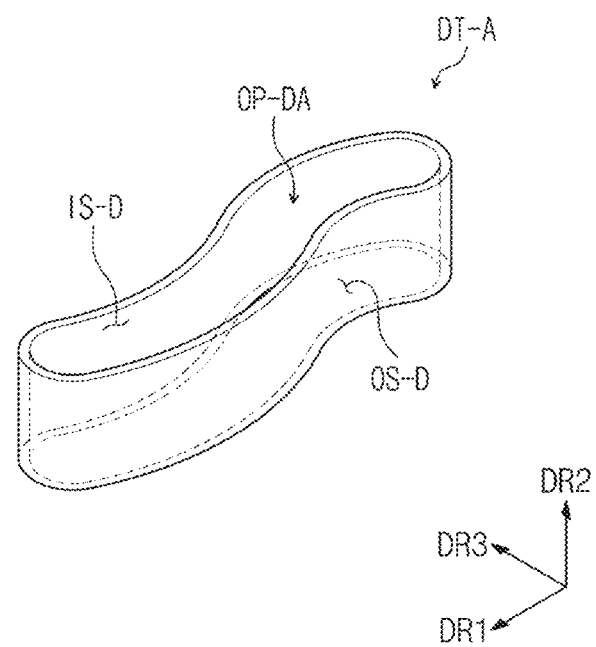
FIG. 5C is a perspective view of an embodiment of a passive element according to the invention.
Figure 6:
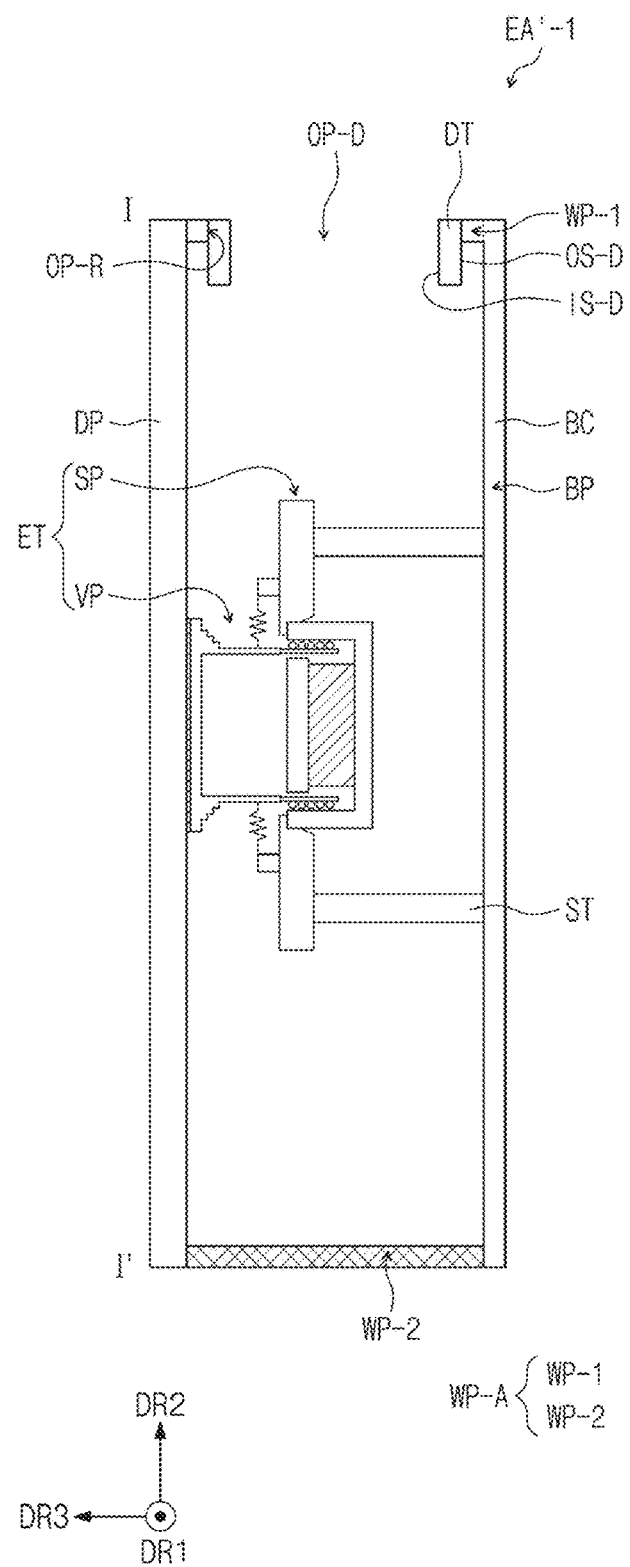
FIG. 6 is a cross-sectional view of an embodiment of an electronic apparatus taken along line I-I' of FIG. 1 according to the invention.

FIG. 5A is a cross-sectional view of an embodiment of an electronic apparatus EA' taken along line I-I' of FIG. 1 according to the invention. FIG. 5B is a perspective view of an embodiment of a passive element according to the invention. FIG. 5C is a perspective view of an embodiment of a passive element according to the invention. FIG. 6 is a cross-sectional view of an embodiment of an electronic apparatus EA'-1 taken along line I-I' of FIG. 1 according to the invention.

Referring to FIGS. 5A to 5C, the electronic apparatus EA' may include a display panel DP, a rear cover BC, an exciter ET, a support stick ST, and a duct DT. In FIGS. 5A to 5C, the same/similar reference numerals denote the same/similar elements in FIGS. 1 and 4B, and thus, detailed descriptions of the same/similar elements will be omitted.

In the illustrated embodiment, a rear surface portion BP and a sidewall portion WP of the rear cover BC may be unitary with each other. The rear surface portion BP and the sidewall portion WP of the rear cover BC may include the same material. In an embodiment, the rear surface portion BP and the sidewall portion WP of the rear cover BC may include a metal material.

In the illustrated embodiment, the passive element PE (refer to FIG. 2) may be the duct DT. Referring to FIGS. 5B and 5C, the duct DT may have a column shape through which an opening is defined. The duct DT may include an inner surface IS-D defining a duct opening OP-D and an outer surface OS-D opposite to the inner surface IS-D.

In an embodiment, the duct opening OP-D may have an oval shape as shown in FIG. 5B. The duct opening OP-D may have the oval shape with a major radius extending in the first direction DR1 and a minor radius extending in the third direction DR3, however, it should not be limited thereto or thereby. In an embodiment, the duct opening OP-D may have a circular shape.

In an embodiment, a duct opening OP-DA may have an S shape as shown in FIG. 5C, however, it should not be limited thereto or thereby. In an embodiment, the shape of the duct opening OP-DA should not be particularly limited as long as the duct opening OP-DA has an atypical shape with at least one curved side.

In a case where a length of the duct DT-A in the first direction DR1 is the same as a length of the duct DT in the first direction DR1, the duct opening OP-DA having the S shape may have a wider cross-sectional area than that of the duct opening OP-D having the oval shape, and thus, the duct DT-A may emit the sound with a lower frequency in the low range.

As shown in FIG. 5A, the duct DT may be inserted into a reinforcement opening OP-R defined in a first sidewall W1. The outer surface OS-D of the duct DT may cover an inner side surface of the rear cover BC defining the reinforcement opening OP-R. The duct DT may overlap the exciter ET in the direction passing through the reinforcement opening OP-R, i.e., the second direction DR2.

In an embodiment of the invention, a vibration output from the exciter ET may be transmitted to the duct DT after sequentially passing through the display panel DP and an inner space P. In this case, the duct DT may emit a resonant sound, which is obtained by amplifying a sound in a band corresponding to a resonant frequency, to the outside of the electronic apparatus EA' through the duct opening OP-D. Accordingly, the duct DT may emit the sound in the low range.

The duct DT may emit the sound such that the sound may be emitted in a direction from inside to outside of the electronic apparatus EA', i.e., the upward direction, after passing through the duct opening OP-D. Accordingly, the electronic apparatus EA' may implement an overhead sound and more 3D sound. That is, the electronic apparatus EA' may implement Dolby Atmos®.

In an embodiment of the invention, even though a separate speaker unit, which implements the overhead sound, is not provided to the electronic apparatus EA', the electronic apparatus EA' may implement the 3D sound. Accordingly, it is possible to provide the electronic apparatus EA' that implements the 3D sound even to a place with space constraint.

Referring to FIG. 6, the electronic apparatus EA'-1 may include a display panel DP, a rear cover BC, an exciter ET, a support stick ST, and a duct DT. In FIG. 6, the same/similar reference numerals denote the same/similar elements in FIGS. 1 and 5C, and thus, detailed descriptions of the same/similar elements will be omitted.

In the illustrated embodiment, different from the sidewall portion WP shown in FIG. 5A, a sidewall portion WP-A of a rear cover BC may include a first portion WP-1 and a second portion WP-2, and the portion WP-1 may include a material different from a material of the second portion WP-2.

In the illustrated embodiment, the first portion WP-1 may correspond to the first sidewall W1 (refer to FIG. 2). The first portion WP-1 may be unitary with a rear surface portion BP of the rear cover BC. The rear surface portion BP of the rear cover BC and the first portion WP-1 of the sidewall portion WP-A may include a metal material.

In the illustrated embodiment, the second portion WP-2 may correspond to the second, third, and fourth sidewalls W2, W3, and W4 (refer to FIG. 2). The second portion WP-2 may include an adhesive material. In an embodiment, the second portion WP-2 may be a double-sided tape, however, it should not be limited thereto or thereby. In an embodiment, the second portion WP-2 may include a sealing member and may include an elastic member. The second portion WP-2 may absorb the vibration of the display panel DP and may prevent the electronic apparatus EA'-1 from being damaged due to the vibration of the display panel DP.

Figure 7:
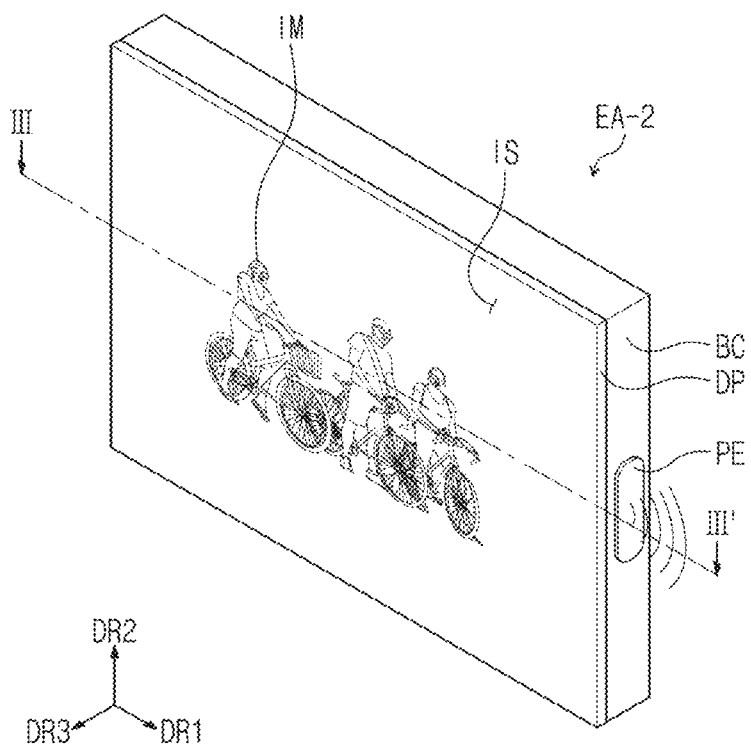
FIG. 7 is a perspective view of an electronic apparatus according to the invention.
Figure 8B:
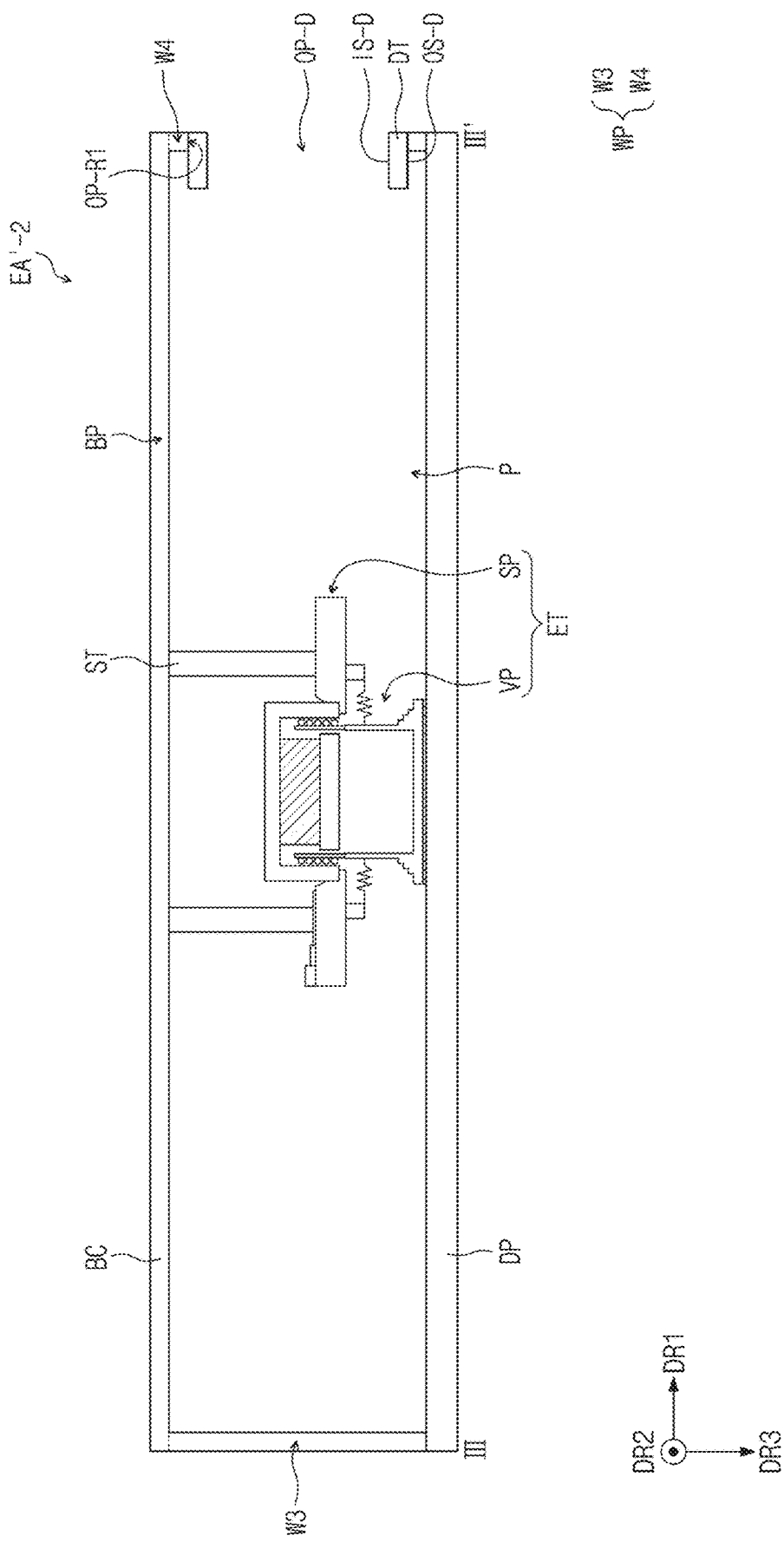
FIG. 8B is a cross-sectional view of an electronic apparatus taken along line III-III' of FIG. 7 according to the invention.

FIG. 7 is a perspective view of an embodiment of an electronic apparatus EA-2 according to the invention. FIG. 8A is a cross-sectional view of an embodiment of the electronic apparatus EA-2 taken along line III-III' of FIG. 7 according to the invention. FIG. 8B is a cross-sectional view of an embodiment of an electronic apparatus EA'-2 taken along line III-III' of FIG. 7 according to the invention. In FIGS. 7, 8A, and 8B, the same/similar reference numerals denote the same/similar elements in FIGS. 1 and 6, and thus, detailed descriptions of the same/similar elements will be omitted.

Referring to FIG. 7, the electronic apparatus EA-2 may include a display panel DP, a rear cover BC, and a passive element PE. In the illustrated embodiment, the passive element PE may be disposed at a position covering an opening defined through the rear cover BC along the first direction DR1. Accordingly, the electronic apparatus EA-2 may output a sound to the third direction DR3 and the first direction DR1. FIG. 8A shows the electronic apparatus EA-2 employing a passive radiator PR as the passive element PE, and FIG. 8B shows the electronic apparatus EA'-2 employing a duct DT as the passive element PE.

Referring to FIG. 8A, a reinforcement opening OP-R1 may be defined through a fourth sidewall W4. The reinforcement opening OP-R1 may penetrate through the fourth sidewall W4 in a direction from a third side edge to a fourth side edge of the display panel DP, e.g., the first direction DR1 that goes from a left side edge to a right side edge.

The passive radiator PR may be disposed in the reinforcement opening OP-R1 defined through the fourth sidewall W4. An edge portion EG of the passive radiator PR may be coupled with the fourth sidewall W4 and may fix a passive vibrator PV to be spaced apart from an exciter ET in the first direction DR1.

Referring to FIG. 8B, the duct DT may be disposed in a reinforcement opening OP-R1 defined through a fourth sidewall W4. Accordingly, a penetration direction of a duct opening OP-D may be substantially parallel to the first direction DR1. An outer surface OS-D of the duct DT may be fixed to an inner side surface of the fourth sidewall W4 defining the reinforcement opening OP-R1.

By the embodiments, the sound may be output to a lateral direction of the electronic apparatuses EA-2 and EA'-2, e.g., a right direction, and the sound output to the lateral direction may be reflected by a wall and then may be transmitted in a lateral direction of the viewer watching the image of the electronic apparatuses EA-2 and EA'-2. Accordingly, the electronic apparatuses EA-2 and EA'-2 may implement a surround sound and more 3D sound. That is, the electronic apparatuses EA-2 and EA'-2 may implement Dolby Atmos®.

Figure 9:
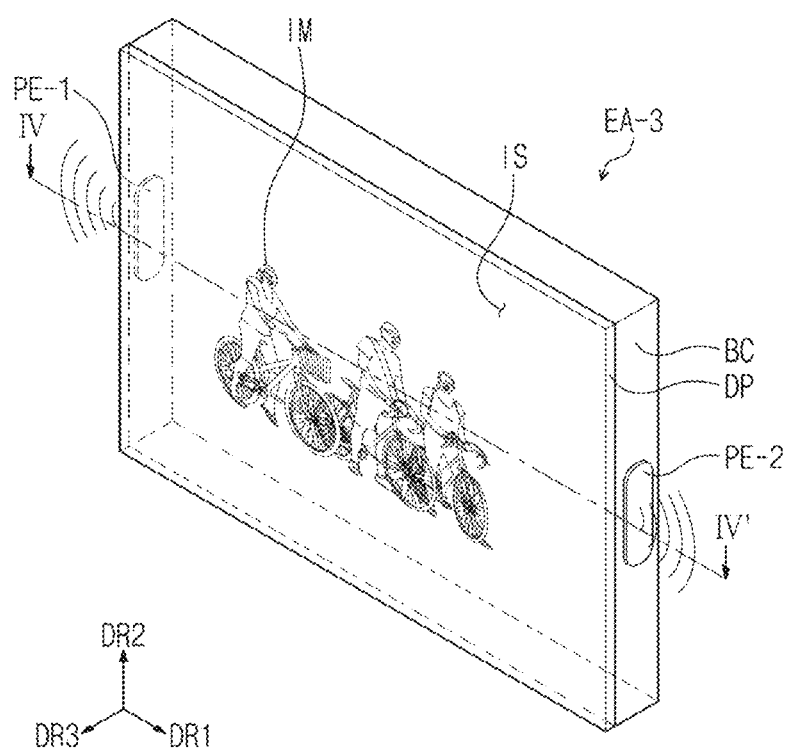
FIG. 9 is a perspective view of an embodiment of an electronic apparatus according to the invention.
Figure 10A:
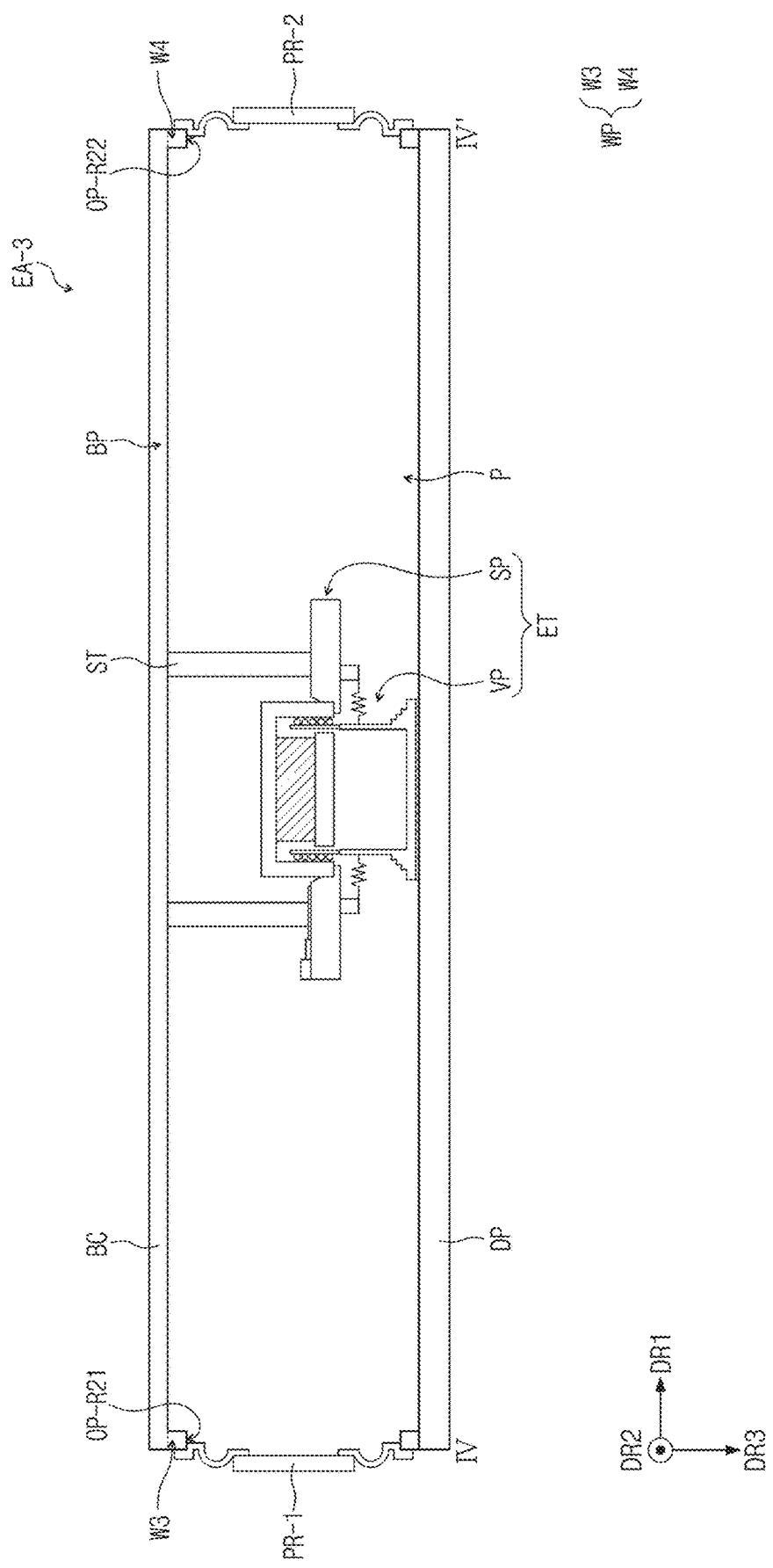
FIG. 10A is a cross-sectional view of an embodiment of an electronic apparatus taken along line IV-IV' of FIG. 9 according to the invention.
Figure 10B:
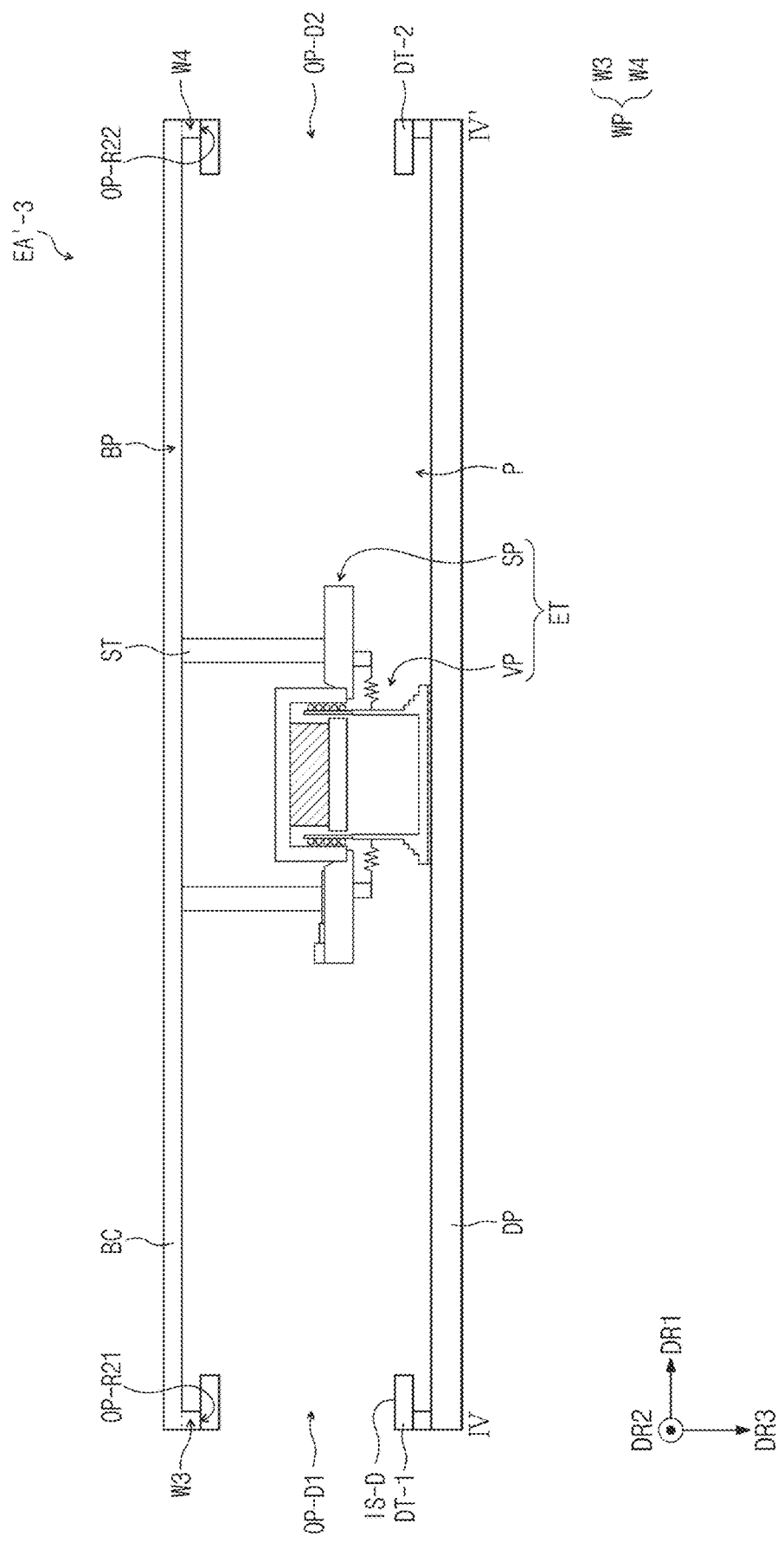
FIG. 10B is a cross-sectional view of an embodiment of an electronic apparatus taken along line IV-IV' of FIG. 9 according to the invention.

FIG. 9 is a perspective view of an embodiment of an electronic apparatus EA-3 according to the invention. FIG. 10A is a cross-sectional view of an embodiment of the electronic apparatus EA-3 taken along line IV-IV' of FIG. 9 according to the invention. FIG. 10B is a cross-sectional view of an embodiment of an electronic apparatus EA'-3 taken along line IV-IV' of FIG. 9 according to the invention. In FIGS. 9, 10A, and 10B, the same/similar reference numerals denote the same/similar elements in FIGS. 1 and 8B, and thus, detailed descriptions of the same/similar elements will be omitted.

Referring to FIG. 9, the electronic apparatus EA-3 may include a plurality of passive elements PE-1 and PE-2. In the illustrated embodiment, the passive elements PE-1 and PE-2 may include a first passive element PE-1 and a second passive element PE-2, which are spaced apart from each other in the first direction DR1.

The first and second passive elements PE-1 and PE-2 may respectively cover openings defined through the rear cover BC in the first direction DR1 and may be spaced apart from each other in the first direction DR1. The first passive element PE-1 may output a sound to a direction opposite to the first direction DR1, and the second passive element PE-2 may output the sound to the first direction DR1.

FIG. 10A shows the electronic apparatus EA-3 employing passive radiators PR-1 and PR-2 as a illustrative embodiment of the passive elements PE-1 (refer to FIG. 9) and PE-2 (refer to FIG. 9), and FIG. 10B shows the electronic apparatus EA'-3 employing ducts DT-1 and DT-2 as a illustrative embodiment of the passive elements PE-1 and PE-2.

Referring to FIG. 10A, a plurality of reinforcement openings OP-R21 and OP-R22 may be defined through a sidewall portion WP of a rear cover BC. The reinforcement openings OP-R21 and OP-R22 may include a first reinforcement opening OP-R21 defined through a third sidewall W3 and a second reinforcement opening OP-R22 defined through a fourth sidewall W4. The first and second reinforcement openings OP-R21 and OP-R22 may be defined through the third and fourth sidewalls W3 and W4, respectively, in the first direction DR1.

The passive radiators PR-1 and PR-2 may include a first passive radiator PR-1 and a second passive radiator PR-2.

The first passive radiator PR-1 may be disposed in the first reinforcement opening OP-R21. An edge portion EG (refer to FIG. 3A) of the first passive radiator PR-1 may be coupled with the third sidewall W3 and may fix a passive vibrator PV (refer to FIG. 3A) of the first passive radiator PR-1 to be spaced apart from an exciter ET in the first direction DR1.

The second passive radiator PR-2 may be disposed in the second reinforcement opening OP-R22. An edge portion EG (refer to FIG. 3A) of the second passive radiator PR-2 may be coupled with the fourth sidewall W4 and may fix a passive vibrator PV (refer to FIG. 3A) of the second passive radiator PR-2 to be spaced apart from the exciter ET in the first direction DR1.

Referring to FIG. 10B, a first duct DT-1 may be disposed in a first reinforcement opening OP-R21 defined through a third sidewall W3, and a second duct DT-2 may be disposed in a second reinforcement opening OP-R22 defined through a fourth sidewall W4. Accordingly, a duct opening OP-D1 of the first duct DT-1 and a duct opening OP-D2 of the second duct DT-2 may be defined in the first direction DR1.

An outer surface OS-D (refer to FIG. 5B) of the first duct DT-1 may be fixed to an inner side surface of the third sidewall W3, which defines the first reinforcement opening OP-R21, and an outer surface OS-D (refer to FIG. 5B) of the second duct DT-2 may be fixed to an inner side surface of the fourth sidewall W4, which defines the second reinforcement opening OP-R22. The first duct DT-1 and the second duct DT-2 may be disposed parallel to each other in the first direction DR1.

In the illustrated embodiment, the sound may be output to a lateral direction of opposite sides of the electronic apparatuses EA-3 and EA'-3 due to the passive radiators PR-1 and PR-2 or the ducts DT-1 and DT-2, and the sound output to both lateral directions may be reflected by a wall and then may be transmitted in a lateral direction of the viewer watching the image of the electronic apparatuses EA-3 and EA'-3.

Accordingly, the electronic apparatuses EA-3 and EA'-3 may implement a surround sound. The electronic apparatuses EA-3 and EA'-3 may output the sound to the front of the viewer and the both lateral directions of the viewer, and thus, the electronic apparatuses EA-3 and EA'-3 may implement more 3D sound. In this case, the electronic apparatuses EA-3 and EA'-3 may transmit the sound in opposite directions symmetrically, and thus, the electronic apparatuses EA-3 and EA'-3 may implement a more 3D and balanced sound. That is, the electronic apparatuses EA-3 and EA'-3 may implement Dolby Atmos®.

Figure 11A:
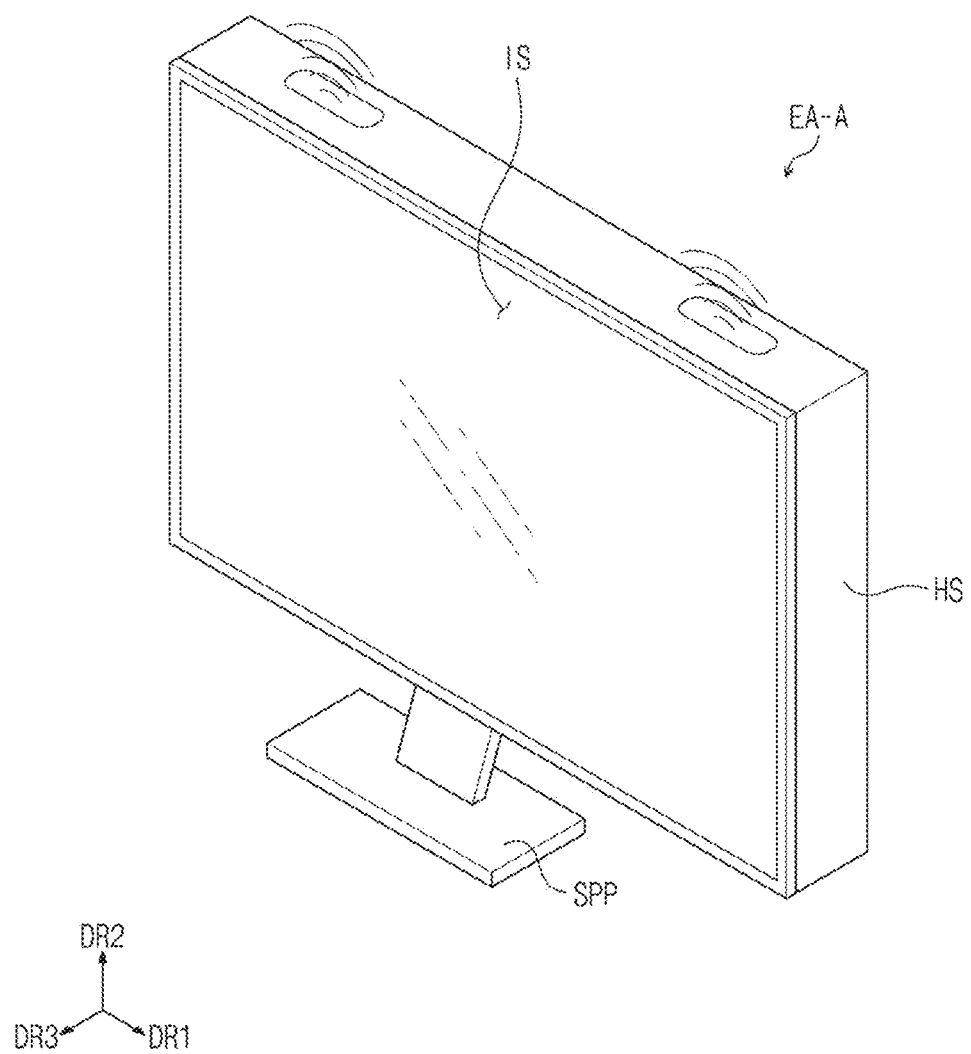
FIG. 11A is a perspective view of an embodiment of an electronic apparatus according to the invention.
Figure 11B:
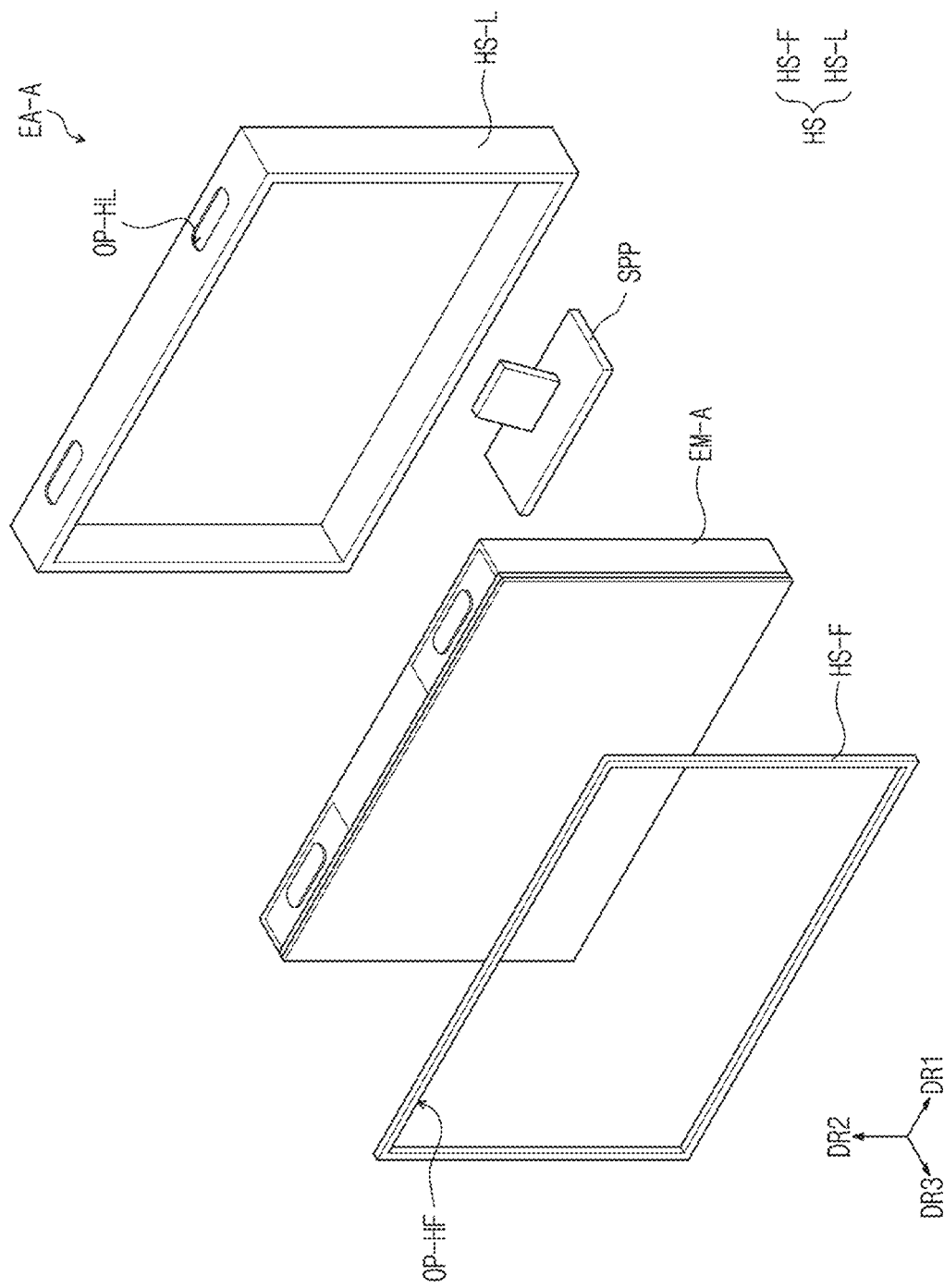
FIG. 11B is an exploded perspective view of an embodiment of an electronic apparatus according to the invention.

FIG. 11A is a perspective view of an embodiment of an electronic apparatus EA-A according to the invention. FIG. 11B is an exploded perspective view of an embodiment of the electronic apparatus EA-A according to the invention.

Referring to FIGS. 11A and 11B, the electronic apparatus EA-A may be an apparatus activated in response to an electrical signal. The electronic apparatus EA-A may include various embodiments. In an embodiment, the electronic apparatus EA-A may be applied to a large-sized electronic item, such as a television set, a monitor, or an outdoor billboard, and a small and medium-sized electronic item, such as a personal computer, a notebook computer, a personal digital assistant, a car navigation unit, a game unit, a mobile electronic device, and a camera, for example.

These are merely some of embodiments, and thus, the electronic apparatus EA-A may be applied to other electronic devices as long as they do not depart from the concept of the invention. In the illustrated embodiment, the television set will be described as a illustrative embodiment of the electronic apparatus EA-A.

The electronic apparatus EA-A may display the image IM (refer to FIG. 1) through a display surface IS, which is substantially parallel to each of the first direction DR1 and the second direction DR2, toward the third direction DR3. The display surface IS through which the image IM is displayed may correspond to a front surface of the electronic apparatus EA-A. The image IM may include a still image as well as a video.

In the illustrated embodiment, the electronic apparatus EA-A may include an electronic module EM-A, a housing HS, and a support part SPP.

The electronic module EM-A may display the image IM to the front thereof. In addition, the electronic module EM-A may output the sound to the front thereof and to the upward direction thereof. Accordingly, the electronic apparatus EA-A may output the sound without a separate speaker unit. This will be described in detail later.

The housing HS may include a material with a relatively high rigidity. In an embodiment, the housing HS may include a plurality of frames and/or plates of a glass, plastic, or metal material, for example. The housing HS may define a predetermined accommodation space. The electronic module EM-A may be accommodated in the accommodation space of the housing HS and may be protected from external impacts.

The housing HS may be formed or provided by coupling a front frame HS-F with a rear frame HS-L. The front frame HS-F may cover a first surface FS of a display panel DP. A front opening OP-HF may be defined in the front frame HS-F. The display panel DP may be exposed through the front opening OP-HF of the front frame HS-F. The viewer may view the image displayed in the display panel DP through the front opening OP-HF.

The rear frame HS-L may be disposed at a rear of the electronic module EM-A and may be coupled with the front frame HS-F with the electronic module EM-A interposed therebetween. The rear frame HS-L may be coupled with the front frame HS-F and may define the predetermined space in which the electronic module EM-A is accommodated. The electronic module EM-A may be accommodated in the predetermined space and may be protected from external impacts.

A rear opening OP-HL may be defined through the rear frame HS-L. The sound emitted to the upward direction of the electronic module EM-A may be output to the outside of the electronic apparatus EA-A through the rear opening OP-HL. A shape of the rear opening OP-HL should not be particularly limited as long as a path through which the sound is output to the outside of the electronic apparatus EA-A is provided.

The electronic apparatus EA-A may further include the support part SPP. The support part SPP may support the housing HS such that the electronic apparatus EA-A may be stably disposed (e.g., mounted), however, this is merely one of embodiments. In an embodiment, the support part SPP may be unitary with the housing HS or may be omitted.

Figure 12:
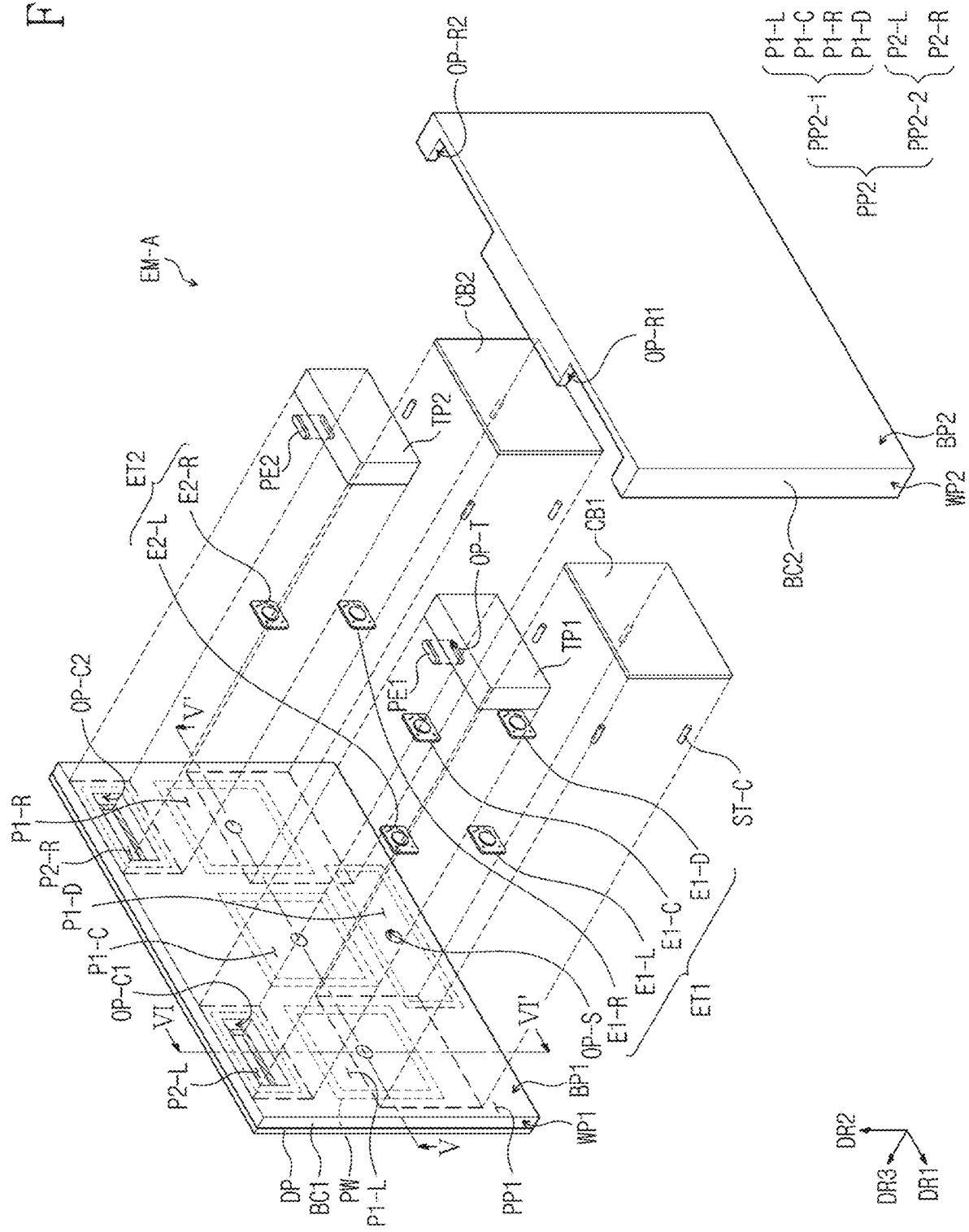
FIG. 12 is an exploded perspective view of an embodiment of some components of an electronic apparatus according to the invention.
Figure 13A:
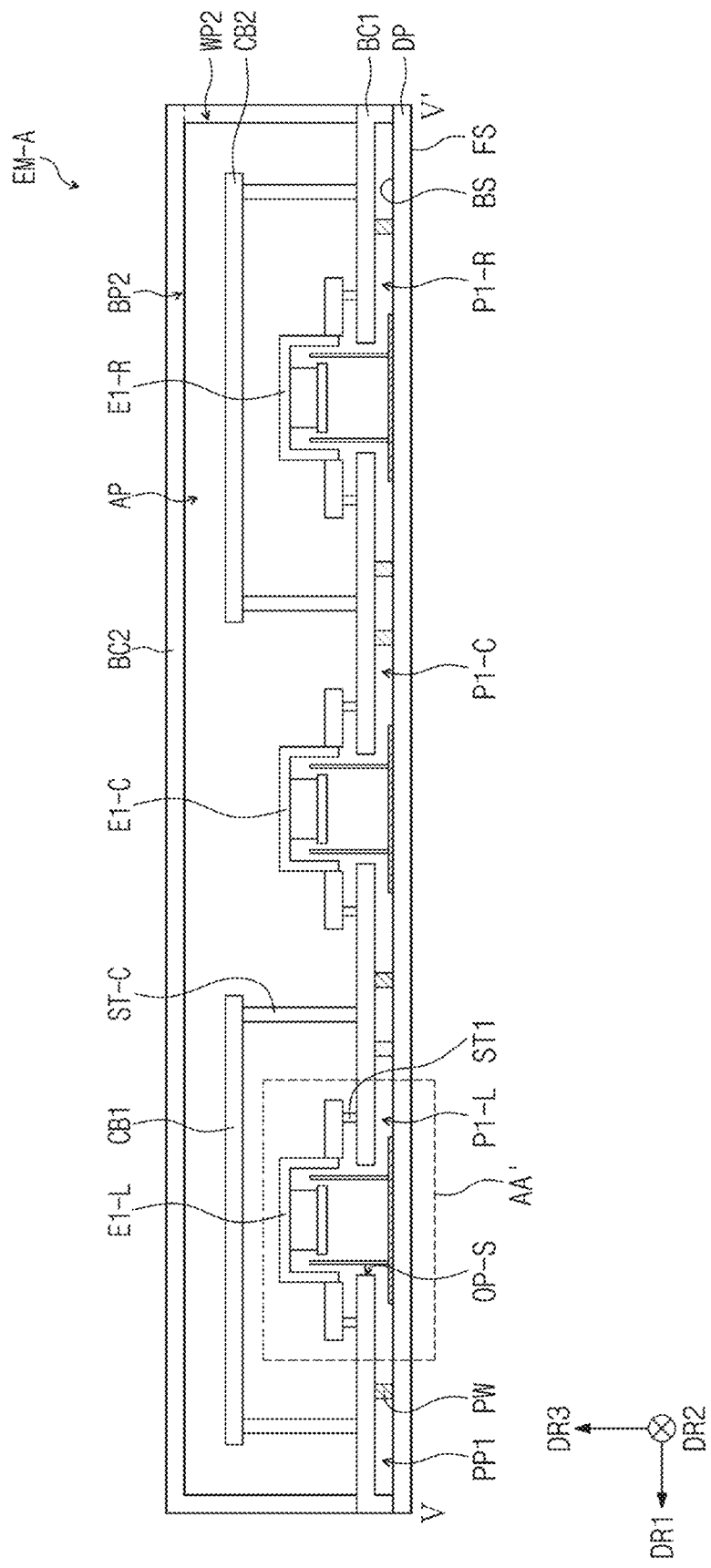
FIG. 13A is a cross-sectional view of an embodiment of an electronic module taken along line V-V' of FIG. 12 according to the invention.
Figure 13B:
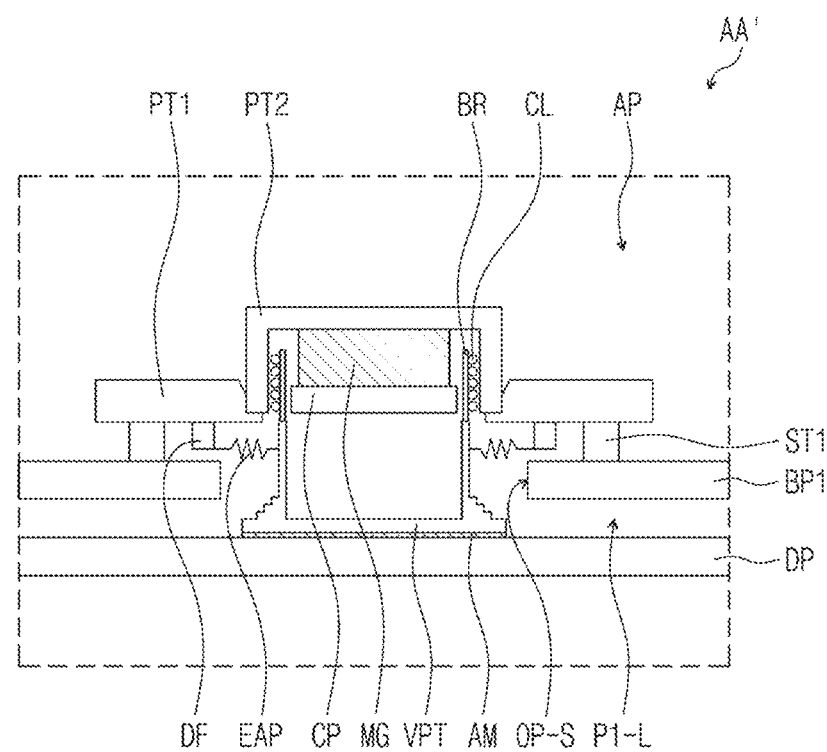
FIG. 13B is an enlarged view of an area AA' of FIG. 13A to show an embodiment of some components of an electronic module according to the invention.
Figure 13B:
Figure 13C:
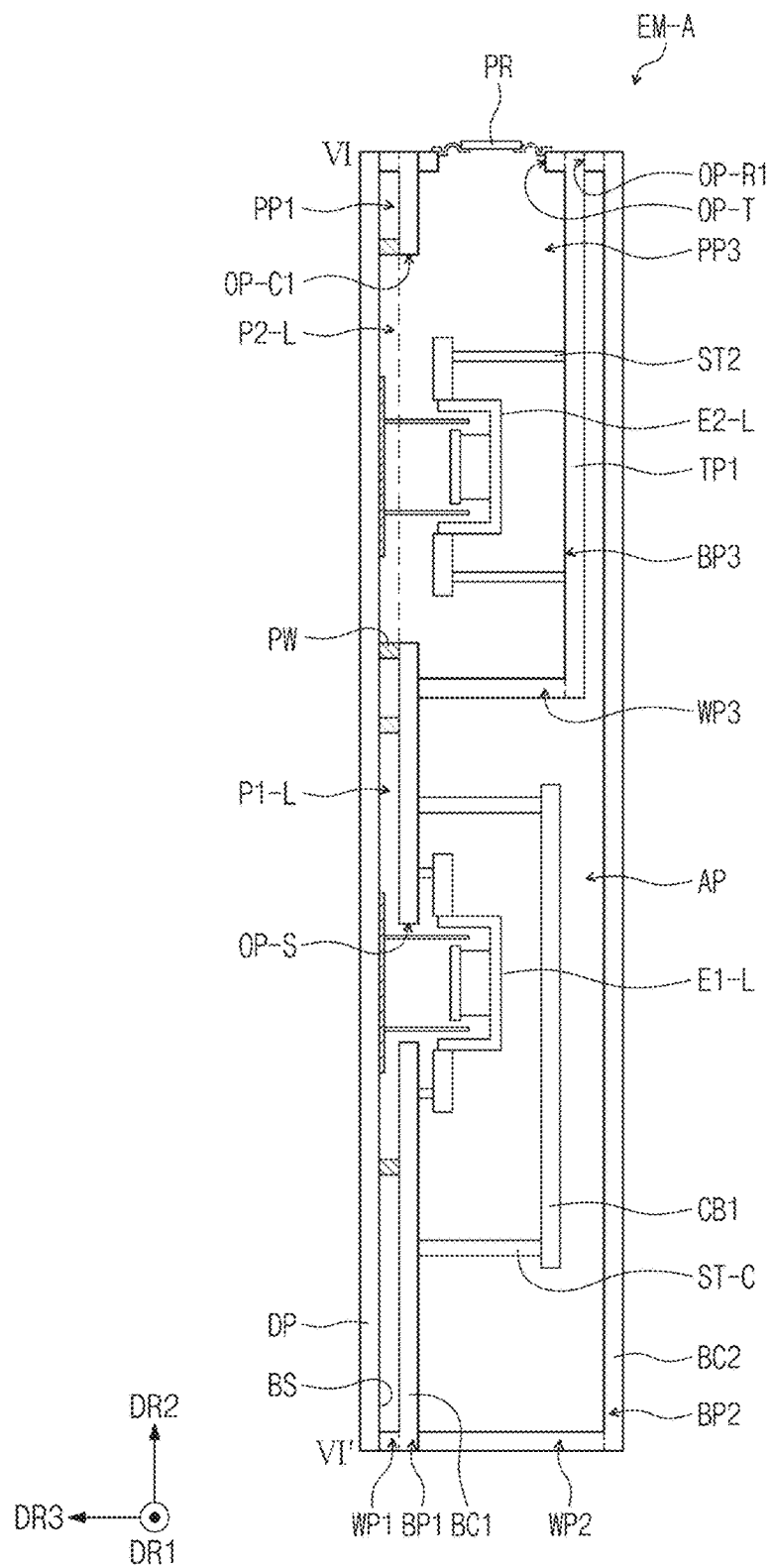
FIG. 13C is a cross-sectional view of an embodiment of an electronic module taken along line VI-VI' of FIG. 12 according to the invention.

FIG. 12 is an exploded perspective view of an embodiment of some components of an electronic apparatus according to the invention. FIG. 13A is a cross-sectional view of an embodiment of an electronic module EM-A taken along line V-V' of FIG. 12 according to the invention. FIG. 13B is an enlarged view of an embodiment of an area AA' of FIG. 13A to show an embodiment of some components of the electronic module EM-A according to the invention. FIG. 13C is a cross-sectional view of an embodiment of the electronic module EM-A taken along line VI-VI' of FIG. 12 according to the invention. In FIGS. 12 and 13A to 13C, the same/similar reference numerals denote the same/similar elements in FIGS. 1 to 11B, and thus, detailed descriptions of the same/similar elements will be omitted.

Referring to FIG. 12, the electronic module EM-A may include a display panel DP, a first rear cover BC1, a barrier wall part PW, a main exciter ET1, a reinforcement exciter ET2, a transmission part TP1 and TP2, a passive element PE1 and PE2, a circuit board CB1 and CB2, and a second rear cover BC2.

The display panel DP may include a first surface FS (refer to FIG. 13A) through which an image is displayed and a second surface BS (refer to FIG. 13A) opposite to the first surface FS. The first surface FS of the display panel DP may provide a front surface of the electronic apparatus EA-A.

In an embodiment, the display panel DP may have a quadrangular (e.g., rectangular) shape with short sides extending in the second direction DR2 and long sides extending in the first direction DR1 in a plane, however, the shape of the display panel DP should not be limited thereto or thereby.

The display panel DP may include a first side edge, a second side edge, a third side edge, and a fourth side edge. In an embodiment, the first side edge and the fourth side edge may face each other, and the second side edge and the third side edge may face each other. In an embodiment, a first side may correspond to an upper side, a fourth side may correspond to a lower side, a second side may correspond to a left side, and a third side may correspond to a right side in a plan view in a direction facing the second surface BS of the display panel DP. Accordingly, the first side edge may be disposed at the upper side of the display panel DP, and the second side edge and the third side edge may be disposed at opposite sides of the display panel DP, respectively.

Hereinafter, embodiments described with reference to FIGS. 12 to 19 will be described on the basis that the first, second, third, and fourth sides respectively correspond to the upper side, the left side, the right side, and the lower side on the plane viewed in the direction facing the second surface BS of the display panel DP.

The first rear cover BC1 may be disposed on the second surface BS of the display panel DP. In the illustrated embodiment, the first rear cover BC1 may include a first rear surface portion BP1 and a first sidewall portion WP1.

The first rear surface portion BP1 may face the second surface BS of the display panel DP. The first rear surface portion BP1 may have a quadrangular (e.g., rectangular) shape with long sides extending in the first direction DR1 and short sides extending in the second direction DR2 when viewed in a plane, however, the shape of the first rear surface portion should not be limited thereto or thereby.

In the illustrated embodiment, support openings OP-S may be defined through the first rear surface portion BP1. The support openings OP-S may be defined penetrating through the first rear surface portion BP1 of the first rear cover BC1 in the third direction DR3.

The support openings OP-S may have a circular shape in the plane viewed in the direction facing the second surface BS of the display panel DP (hereinafter, the term "in the plane" may mean the plane viewed in the direction facing the second surface BS of the display panel DP), however, the shape of the support openings OP-S should not be limited thereto or thereby.

In the illustrated embodiment, cover openings OP-C1 and OP-C2 may be defined through the first rear surface portion BP1. The cover openings OP-C1 and OP-C2 may be defined penetrating through the first rear surface portion BP1 of the first rear cover BC1 in the third direction DR3. The cover openings OP-C1 and OP-C2 may be disposed on the upper side of the support openings OP-S and may be spaced apart from the support openings OP-S.

The cover openings OP-C1 and OP-C2 may include a first cover opening OP-C1 and a second cover opening OP-C2. The first and second cover openings OP-C1 and OP-C2 may be defined adjacent to the first side edge, e.g., the upper side edge, of the display panel DP. The first and second cover openings OP-C1 and OP-C2 may be spaced apart from each other in the first direction DR1.

The cover openings OP-C1 and OP-C2 may have a quadrangular shape in the plane. However, the shape of the cover openings OP-C1 and OP-C2 should not be limited thereto or thereby.

The first sidewall portion WP1 may be bent from the first rear surface portion BP1 along the third direction DR3. The first sidewall portion WP1 may include sidewalls respectively extending in the first direction DR1 and the second direction DR2.

In the illustrated embodiment, the first rear surface portion BP1 and the first sidewall portion WP1 may be coupled with the display panel DP to define a first inner space PP1. The first inner space PP1 may include a plurality of second inner spaces PP2 spaced apart from each other.

In detail, the second inner spaces PP2 may include first sub-spaces PP2-1 and second sub-spaces PP2-2. The second inner spaces PP2 may be defined by spaces respectively surrounded by the barrier wall parts PW.

The first sub-spaces PP2-1 may include a first space P1-L, a second space P1-C, a third space P1-R, and a fourth space P1-D, which are defined spaced apart from each other.

The first space P1-L, the second space P1-C, and the third space P1-R may be sequentially arranged in a direction opposite to the first direction DR1. That is, the first space P1-L and the third space P1-R may be spaced apart from each other with the second space P1-C interposed therebetween in the first direction DR1. In an embodiment, the second space P1-C may be defined at a center of the display panel DP in the plane. The first space P1-L may be spaced apart from the second space P1-C to the left side (in the first direction DR1) of the second space P1-C. The third space P1-R may be spaced apart from the second space P1-C to the right side (in the direction opposite to the first direction DR1) of the second space P1-C. The fourth space P1-D may be spaced apart from the second space P1-C to the lower side (a direction opposite to the second direction DR2) of the second space P1-C.

In an embodiment, a length of the fourth space P1-D in the first direction DR1 may be greater than a length of the second space P1-C in the first direction DR1 in the plane. When viewed in the plane, a length of the fourth space P1-D in the second direction DR2 may be shorter than a length of the second space P1-C in the second direction DR2.

In the illustrated embodiment, each of the first space P1-L, the second space P1-C, the third space P1-R, and the fourth space P1-D may overlap a corresponding support opening among the support openings OP-S.

In the illustrated embodiment, the second sub-spaces PP2-2 may be spaced apart from the first sub-spaces PP2-1 to the upper side (the second direction DR2) of the first sub-spaces PP2-1. The second sub-spaces PP2-2 may be defined adjacent to the first side edge of the display panel DP, e.g., the upper side edge.

In an embodiment, the second sub-spaces PP2-2 may include a fifth space P2-L and a sixth space P2-R. The fifth space P2-L may be spaced apart from the first space P1-L to the upper side of the first space P1-L. The sixth space P2-R may be spaced apart from the third space P1-R to the upper side of the third space P1-R.

FIG. 12 shows a structure in which the barrier wall parts PW are arranged to define the second inner spaces PP2 each having a quadrangular shape in the plane as a illustrative embodiment, however, the shape of the second inner spaces PP2 defined by the barrier wall parts PW should not be limited thereto or thereby.

The main exciter ET1 may be disposed on the second surface BS of the display panel DP.

In the illustrated embodiment, the main exciter ET1 may be provided in plural. The main exciters ET1 may include a first main exciter E1-L, a second main exciter E1-C, a third main exciter E1-R, and a fourth main exciter E1-D. Each of the main exciters ET1 may be disposed in a corresponding first sub-space among the first sub-spaces PP2-1.

The first main exciter E1-L may be disposed in the first space P1-L, the second main exciter E1-C may be disposed in the second space P1-C, and the third main exciter E1-R may be disposed in the third space P1-R. Accordingly, the first main exciter E1-L, the second main exciter E1-C, and the third main exciter E1-R may be sequentially arranged in the direction opposite to the first direction DR1.

The fourth main exciter E1-D may be disposed in the fourth space P1-D. Accordingly, the fourth main exciter E1-D may be spaced apart from the second main exciter E1-C to the lower side of the second main exciter E1-C.

In the illustrated embodiment, the first main exciter E1-L, the second main exciter E1-C, and the third main exciter E1-R may vibrate the display panel DP such that a sound in a middle and high range is emitted forward. The sound in the middle and high range may have a frequency equal to or greater than about 200 hertz (Hz) and equal to or smaller than about 20000 Hz, however, it should not be limited thereto or thereby. In an embodiment, the first main exciter E1-L, the second main exciter E1-C, and the third main exciter E1-R may vibrate the display panel DP such that a full range sound is emitted forward.

In the illustrated embodiment, the first main exciter E1-L may emit the sound of the image output from the right side of the display panel DP when viewed in a direction facing the first surface FS of the display panel DP. The third main exciter E1-R may emit the sound of the image output from the left side of the display panel DP when viewed in the direction facing the first surface FS of the display panel DP. The second main exciter E1-C may emit the sound of the image output from the center of the display panel DP when viewed in the direction facing the first surface FS of the display panel DP. That is, an image generation position of the electronic apparatus EA-A is subdivided and the sound corresponding to the subdivided positions is emitted, and thus, the immersion of the viewer who watches the image of the electronic apparatus EA-A may be improved.

In the illustrated embodiment, the fourth main exciter E1-D may vibrate the display panel DP such that the sound in the low range may be emitted forward. The sound in the low range may have a frequency equal to or greater than about 20 Hz and equal to or smaller than about 200 Hz. A frequency of the sound emitted from the fourth main exciter E1-D may be changed depending on a magnetic force of a magnet MG of the fourth main exciter E1-D or a width of the fourth space P1-D in the plane.

The reinforcement exciter ET2 may be disposed on the second surface BS of the display panel DP.

In the illustrated embodiment, the reinforcement exciter ET2 may be provided in plural. The reinforcement exciters ET2 may be spaced apart from the main exciters ET1 to the upper side of the main exciters ET1. Each of the reinforcement exciters ET2 may be disposed in a corresponding second sub-space among the second sub-spaces PP2-2.

In an embodiment, the reinforcement exciters ET2 may include a first reinforcement exciter E2-L and a second reinforcement exciter E2-R.

The first reinforcement exciter E2-L may be disposed in the fifth space P2-L and may be spaced apart from the first main exciter E1-L to the upper side of the first main exciter E1-L. The second reinforcement exciter E2-R may be disposed in the sixth space P2-R, and the second reinforcement exciter E2-R may be spaced apart from the third main exciter E1-R to the upper side of the third main exciter E1-R.

The transmission part TP1 and TP2 may be disposed on the first rear cover BC1. A sub-reinforcement opening OP-T may be defined through the transmission part TP1 and TP2. The sub-reinforcement opening OP-T may be defined through the transmission part TP1 and TP2 in the second direction DR2. The sub-reinforcement opening OP-T may be defined adjacent to the first side edge, e.g., the upper side edge, of the display panel DP.

In an embodiment, the transmission part TP1 and TP2 may be provided in plural. The transmission parts TP1 and TP2 may include a first transmission part TP1 and a second transmission part TP2.

The first transmission part TP1 may overlap the first reinforcement exciter E2-L and the fifth space P2-L. The second transmission part TP2 may overlap the second reinforcement exciter E2-R and the sixth space P2-R.

In the illustrated embodiment, the passive element PE1 and PE2 may be disposed in the sub-reinforcement opening OP-T defined through the transmission parts TP1 and TP2. The passive element PE1 and PE2 may be one of a passive radiator PR or a duct DT.

The passive element PE1 and PE2 may be provided in plural. The passive elements PE1 and PE2 may include a first passive element PE1 and a second passive element PE2.

The first passive element PE1 may be disposed in the sub-reinforcement opening OP-T defined through the first transmission part TP1, and the second passive element PE2 may be disposed in the sub-reinforcement opening OP-T defined through the second transmission part TP2. The first and second passive elements PE1 and PE2 may be spaced apart from each other in the first direction DR1.

The circuit board CB1 and CB2 may be disposed above the first rear cover BC1 and may be spaced apart from the first rear cover BC1. In an embodiment, the circuit board CB1 and CB2 may be connected to a circuit support stick ST-C disposed on the first rear cover BC1 and may be fixed to the first rear cover BC1. However, the fixing manner of the circuit board CB1 and CB2 should not be limited thereto or thereby. In an embodiment, the circuit board CB1 and CB2 may contact the first rear cover BC1.

The circuit board CB1 and CB2 may be provided in plural. The circuit boards CB1 and CB2 may include a first circuit board CB1 and a second circuit board CB2. The first circuit board CB1 may overlap the first main exciter E1-L.

The second circuit board CB2 may overlap the third main exciter E1-R. The first and second circuit boards CB1 and CB2 may be spaced apart from each other in the first direction DR1.

The first circuit board CB1 may be spaced apart from the first transmission part TP1 in the second direction DR2. The second circuit board CB2 may be spaced apart from the second transmission part TP2 in the second direction DR2.

In an embodiment, the first circuit board CB1 may be an image board, and the second circuit board CB2 may be a power board. The first circuit board CB1 may be electrically connected to the display panel DP and the coil included in the vibrator of each of the main exciter ET1 and the reinforcement exciter ET2. The first circuit board CB1 may apply a signal related to the image provision to the display panel DP and may apply a signal related to the sound provision to the main exciter ET1 and the reinforcement exciter ET2.

The second rear cover BC2 may be disposed on the first rear surface portion BP1 of the first rear cover BC1. The second rear cover BC2 may include a second rear surface portion BP2 and a second sidewall portion WP2.

The second rear surface portion BP2 may face the first rear surface portion BP1 of the first rear cover BC1. The second rear surface portion BP2 may have a quadrangular (e.g., rectangular) shape with long sides extending in the first direction DR1 and short sides extending in the second direction DR2 in the plane, however, the shape of the second rear surface portion BP2 should not be limited to thereto or thereby.

The second sidewall portion WP2 may be bent from the second rear surface portion BP2 along the third direction DR3. The second sidewall portion WP2 may include sidewalls respectively extending in the first direction DR1 and the second direction DR2.

In the illustrated embodiment, reinforcement openings OP-R1 and OP-R2 may be defined through the second sidewall portion WP2. In the illustrated embodiment, the reinforcement openings OP-R1 and OP-R2 may be defined in a groove shape by removing a portion of the second sidewall portion WP2 of the second rear cover BC2 along the third direction DR3.

In an embodiment, the reinforcement openings OP-R1 and OP-R2 may be provided in plural. The reinforcement openings OP-R1 and OP-R2 may include a first reinforcement opening OP-R1 and a second reinforcement opening OP-R2. The first reinforcement opening OP-R1 and the second reinforcement opening OP-R2 may be defined in the sidewall adjacent to the first side edge of the display panel DP, e.g., the upper side edge. The first reinforcement opening OP-R1 and the second reinforcement opening OP-R2 may be spaced apart from each other in the first direction DR1.

In the illustrated embodiment, the first reinforcement exciter E2-L may be spaced apart from the first main exciter E1-L in a direction penetrating through the reinforcement openings OP-R1 and OP-R2, i.e., the second direction DR2, and the second reinforcement exciter E2-R may be spaced apart from the third main exciter E1-R in the direction penetrating through the reinforcement openings OP-R1 and OP-R2, i.e., the second direction DR2.

The first transmission part TP1 may be accommodated in the first reinforcement opening OP-R1. The second transmission part TP2 may be accommodated in the second reinforcement opening OP-R2.

FIGS. 13A to 13C show the cross-section in which the first rear cover BC1 and the second rear cover BC2 are coupled with each other. Referring to FIG. 13A, the second rear surface portion BP2 and the second sidewall portion WP2 of the second rear cover BC2 may be coupled with the first rear cover BC1 to define a predetermined accommodation space AP. The main exciters ET1 (refer to FIG. 12), the circuit boards CB1 and CB2, and the circuit support sticks ST-C may be disposed in the accommodation space AP.

Each of the first main exciter E1-L, the second main exciter E1-C, and the third main exciter E1-R may be disposed in a corresponding support opening among the support openings OP-S defined through the first rear cover BC1.

A portion of the first main exciter E1-L may be accommodated in the first space P1-L, and the other portion of the first main exciter E1-L may be accommodated in the accommodation space AP. In this case, the first main exciter E1-L may be spaced apart from the first circuit board CB1 and may be disposed on the lower side of the first circuit board CB1.

A portion of the second main exciter E1-C may be accommodated in the second space P1-C, and the other portion of the second main exciter E1-C may be accommodated in the accommodation space AP. In this case, the second main exciter E1-C may not overlap the circuit boards CB1 and CB2.

A portion of the third main exciter E1-R may be accommodated in the third space P1-R, and the other portion of the third main exciter E1-R may be accommodated in the accommodation space AP. In this case, the third main exciter E1-R may be spaced apart from the second circuit board CB2 and may be disposed on the lower side of the second circuit board CB2.

Referring to FIG. 13B, the first main exciter E1-L may include a supporter SP and a vibrator VP.

The supporter SP may be disposed on the first rear surface portion BP1 of the first rear cover BC1 (refer to FIG. 13A) and may be accommodated in the accommodation space AP. In the illustrated embodiment, as a first support plate PT1 is connected to a first support stick ST1 extending from the first rear surface portion BP1 to the third direction DR3, the supporter SP may be fixed to the first rear cover BC1.

The vibrator VP may penetrate through the support opening OP-S, and at least a portion of a vibrating plate VPT may be accommodated in the first space P1-L. In an embodiment, one end portion of the vibrating plate VPT adjacent to the display panel DP may be accommodated in the first space P1-L. The other end portion of the vibrating plate VPT adjacent to a bobbin ring BR and other components of the vibrator VP may be accommodated in the accommodation space AP.

Referring to FIG. 13C, an inner side surface defining the first cover opening OP-C1 may be aligned with a barrier wall part defining the fifth space P2-L among the barrier wall parts PW. Accordingly, the fifth space P2-L may not be covered by the first rear cover BC1.

The transmission parts TP1 and TP2 (refer to FIG. 12) may be disposed in the accommodation space AP. Each of the transmission parts TP1 and TP2 may be disposed between the first rear cover BC1 and the second rear cover BC2. Hereinafter, the transmission part will be described with reference to the first transmission part TP1 shown in FIG. 13C.

The first transmission part TP1 may cover the first cover opening OP-C1 defined through the first rear cover BC1. The first transmission part TP1 may include a third rear surface portion BP3 and a third sidewall portion WP3, which define a predetermined third inner space PP3. The fifth space P2-L exposed through the first cover opening OP-C1 may extend to or from the third inner space PP3 in the third direction DR3.

A portion of the third rear surface portion BP3 may face the second surface BS of the display panel DP, which is exposed through the first cover opening OP-C1. The other portion of the third rear surface portion BP3 may face the first rear surface portion BP1.

Second support sticks ST2 may be disposed on the third rear surface portion BP3. The second support sticks ST2 may be connected to a supporter SP (refer to FIG. 3A) of the first reinforcement exciter E2-L. The first reinforcement exciter E2-L may be fixed to the third rear surface portion BP3 by the second support sticks ST2.

The third rear surface portion BP3 may have a quadrangular (e.g., rectangular) shape with long sides extending in the first direction DR1 and short sides extending in the second direction DR2 in the plane. However, the shape of the third rear surface portion BP3 should not be particularly limited as long as the third rear surface portion BP3 may define a predetermined third inner space PP3 extending to or from the second inner space PP2.

The third sidewall portion WP3 may be bent from the third rear surface portion BP3 along the third direction DR3. The third sidewall portion WP3 may include sidewalls extending in the first direction DR1 and the second direction DR2 along edges of the third rear surface portion BP3. The sidewalls of the third sidewall portion WP3 may surround the third inner space PP3.

In an embodiment, the third sidewall portion WP3 may surround the first cover opening OP-C1 when viewed in the plane, however, it should not be limited thereto or thereby. In an embodiment, a portion of the third sidewall portion WP3 may be aligned with the inner side surface of the first rear cover BC1 defining the first cover opening OP-C1.

The sub-reinforcement opening OP-T may be defined through the third sidewall portion WP3 of the first transmission part TP1. The sub-reinforcement opening OP-T may be defined through the third sidewall portion WP3 in the second direction DR2.

In the illustrated embodiment, the sub-reinforcement opening OP-T may be defined in the first reinforcement opening OP-R1. The sub-reinforcement opening OP-T may overlap the first reinforcement exciter E2-L in the second direction DR2.

In the illustrated embodiment, the first passive element PE1 (refer to FIG. 12) may be the passive radiator PR. The passive radiator PR may be disposed in the sub-reinforcement opening OP-T.

In the illustrated embodiment, the fifth space P2-L and the third inner space PP3 extending to or from the fifth space P2-L may be sealed by the display panel DP, the barrier wall part defining the fifth space P2-L among the barrier wall parts PW, the rear cover BC1, the first transmission part TP1, and the passive radiator PR.

In the illustrated embodiment, an air in the fifth space P2-L, which is vibrated by a vibration of the first reinforcement exciter E2-L, may be provided to the third inner space PP3 through the first cover opening OP-C1 and may vibrate the passive vibrator PV of the passive radiator PR with respect to the second direction DR2. Accordingly, the passive radiator PR may output the sound to the upward direction of the electronic module EM-A.

Figure 14:
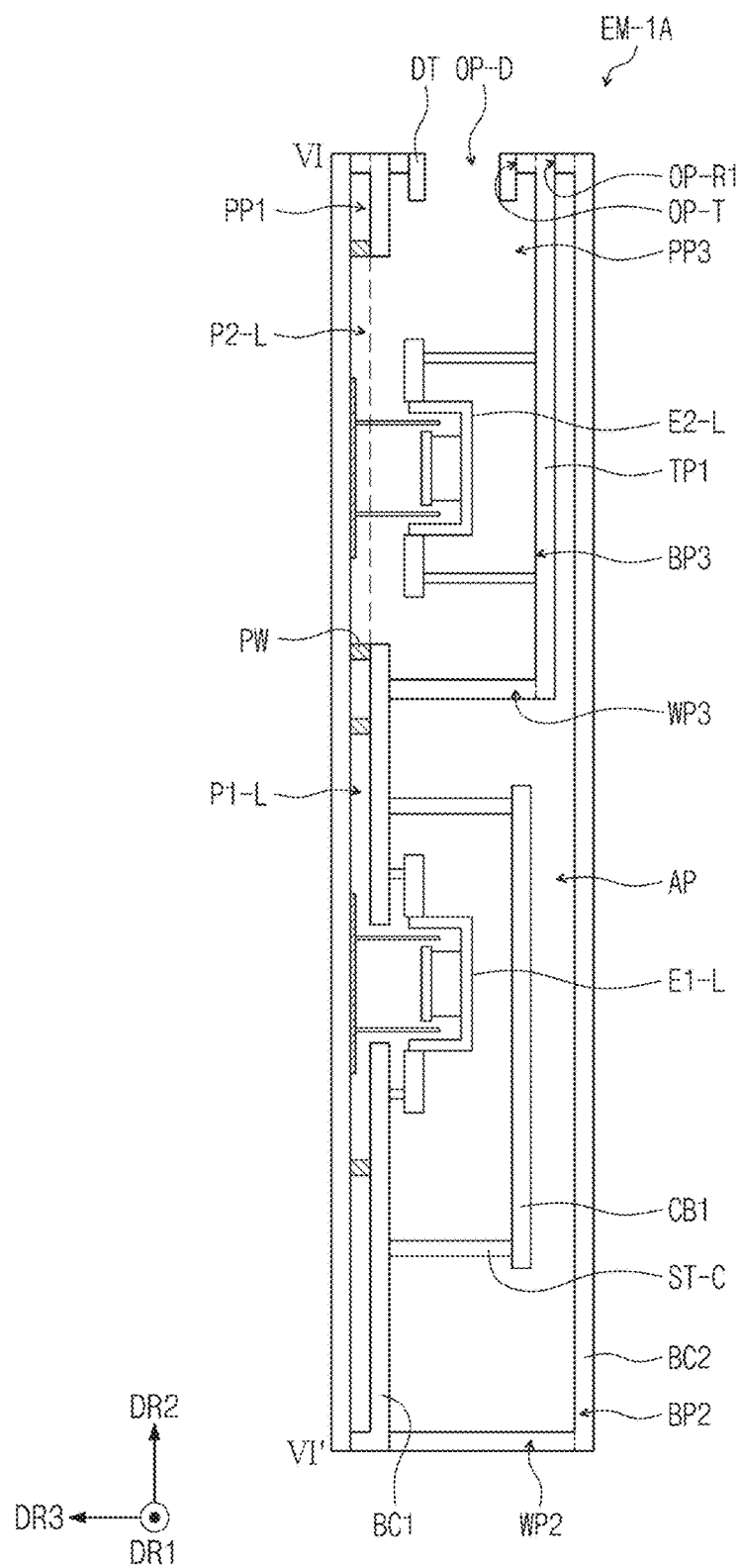
FIG. 14 is a cross-sectional view of an embodiment of an electronic module taken along line VI-VI' of FIG. 12 according to the invention.

FIG. 14 is a cross-sectional view of an electronic module EM-1A taken along line VI-VI' of FIG. 12 according to the invention. FIG. 14 shows an area corresponding to FIG. 13C. In FIG. 14, the same/similar reference numerals denote the same/similar elements in FIGS. 1 to 13C, and thus, detailed descriptions of the same/similar elements will be omitted.

Referring to FIG. 14, the electronic module EM-1A may include a duct DT. The duct DT may be disposed in a sub-reinforcement opening OP-T defined in a first transmission part TP1. An outer surface OS-D (refer to FIG. 5B) of the duct DT may cover an inner side surface of the first transmission part TP1 defining the sub-reinforcement opening OP-T. As shown in FIG. 14, the duct DT may overlap a first reinforcement exciter E2-L in a direction penetrating through the sub-reinforcement opening OP-T, i.e., the second direction DR2.

The duct DT may output a sound to the upward direction of the electronic module EM-1A. Accordingly, the electronic module EM-1A may provide an overhead sound to the viewer and the electronic apparatus EA-A (refer to FIG. 11A) may implement the 3D sound even though a separate speaker unit is not provided to the electronic apparatus EA-A (refer to FIG. 11A). That is, the electronic apparatus EA-A may implement Dolby Atmos®.

Figure 15A:
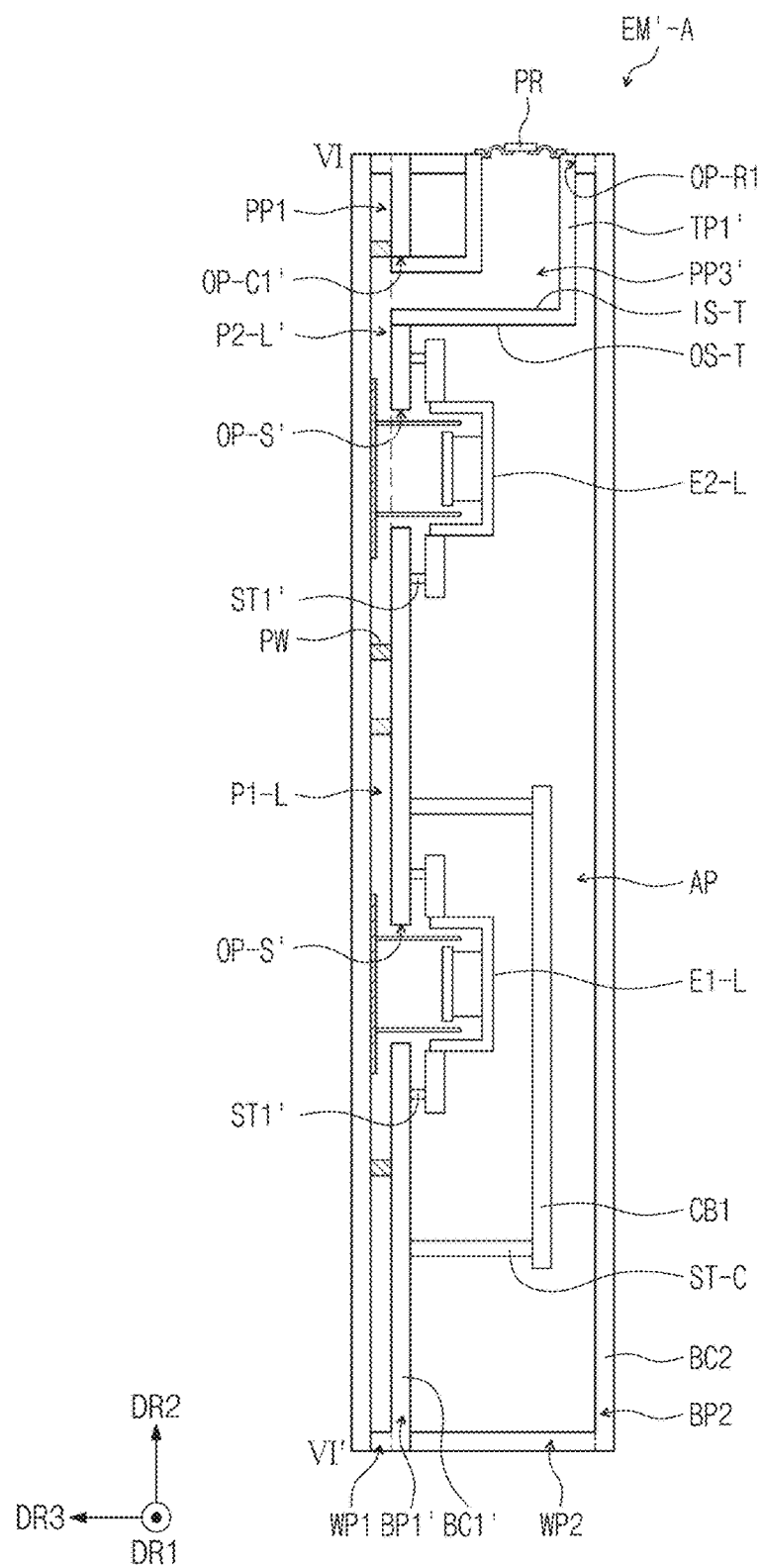
FIG. 15A is a cross-sectional view of an embodiment of an electronic module taken along line VI-VI' of FIG. 12 according to the invention.
Figure 15B:
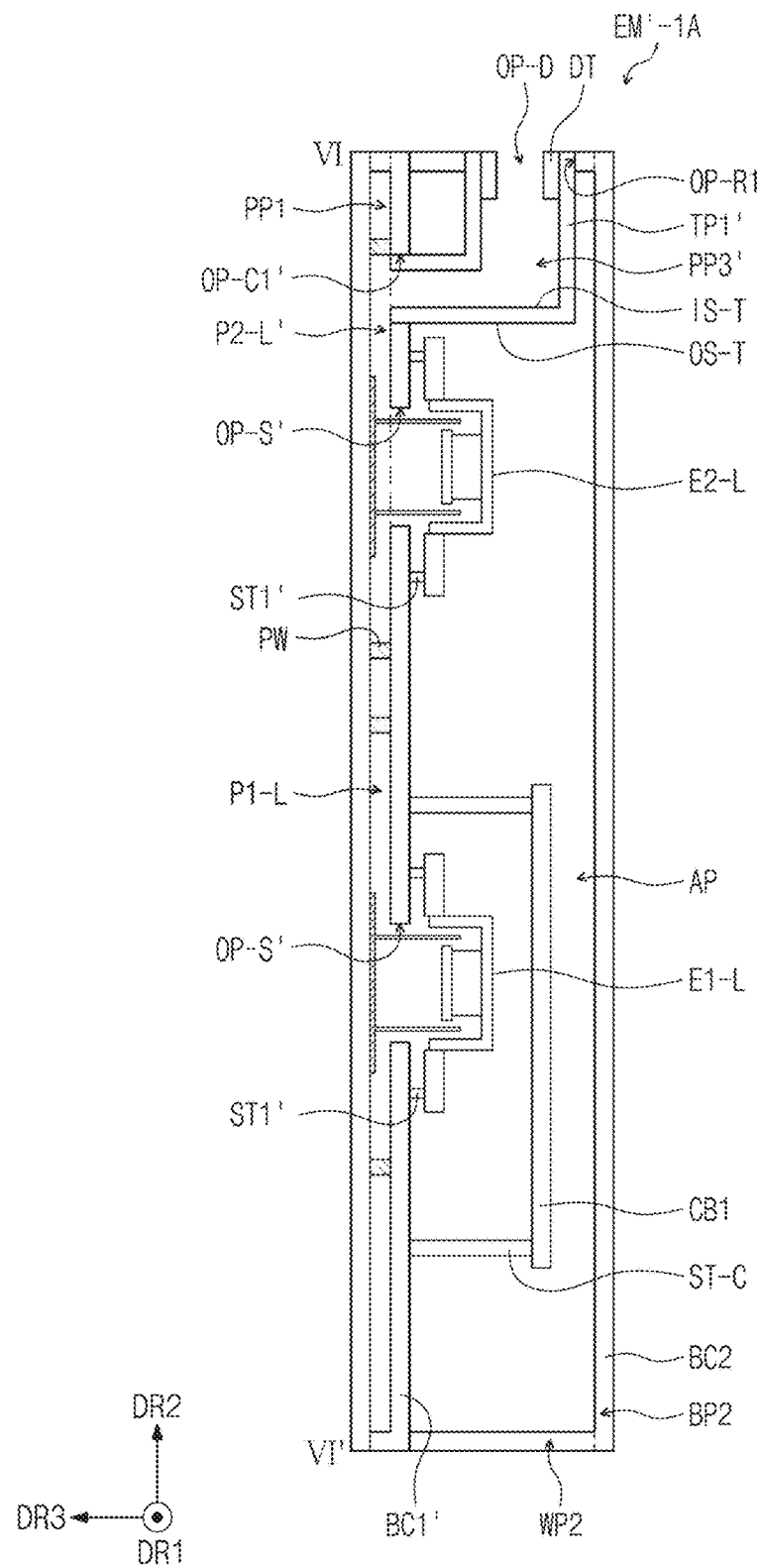
FIG. 15B is a cross-sectional view of an embodiment of an electronic module taken along line VI-VI' of FIG. 12 according to the invention.

FIG. 15A is a cross-sectional view of an embodiment of an electronic module EM'-A taken along line VI-VI' of FIG. 12 according to the invention. FIG. 15B is a cross-sectional view of an embodiment of an electronic module EM'-1A taken along line VI-VI' of FIG. 12 according to the invention. FIGS. 15A and 15B show an embodiment of an area corresponding to FIG. 13C.

Referring to FIG. 15A, a first cover opening OP-C1' may be defined through a first rear surface portion BP1' of a first rear cover BC1'. Different from FIG. 13C, the first cover opening OP-C1' may be surrounded by a barrier wall part, which defines a fifth space P2-L', among barrier wall parts PW, in a plan view and may not overlap a first reinforcement exciter E2-L.

Support openings OP-S' may be defined through the first rear surface portion BP1'. Different from FIG. 13C, the support openings OP-S' may be defined through the first reinforcement exciter E2-L as well as a first main exciter E1-L. A vibrator VP (refer to FIG. 13B) of the first reinforcement exciter E2-L may penetrate a corresponding support opening OP-S'.

A supporter SP (refer to FIG. 3A) of the first reinforcement exciter E2-L may be disposed on the first rear surface portion BP1'. The supporter SP of the first reinforcement exciter E2-L may be connected to a first support stick ST1' and may be fixed to the first rear cover BC1'.

In the illustrated embodiment, a first transmission part TP1' may include an inner surface IS-T defining a transmission opening and an outer surface OS-T facing the inner surface IS-T. The transmission opening may correspond to a third inner space PP3'.

In an embodiment, the first transmission part TP1' may include a portion extending from the first cover opening OP-C1' to the third direction DR3 and a portion extending from the first cover opening OP-C1' to a first reinforcement opening OP-R1 along the second direction DR2. The third inner space PP3' may have an L shape rotated about 180 degrees in a clockwise direction in a cross-section.

However, the shape of the first transmission part TP1' should not be particularly limited as long as the first transmission part TP1' may provide a passage through which an air in the fifth space P2-L' is supplied to the first reinforcement opening OP-R1. In an embodiment, the first transmission part TP1' may be provided in the form of the passage that is defined by only a curved surface with no angular portion.

One end of the first transmission part TP1' may be disposed in the first cover opening OP-C1', and the other end of the first transmission part TP1' may be disposed in the first reinforcement opening OP-R1. In detail, one end portion of the outer surface OS-T of the first transmission part TP1' may cover an inner side surface of the first rear cover BC1', which defines the first cover opening OP-C1'. The other end portion of the outer surface OS-T of the first transmission part TP1' may cover an inner side surface of the first reinforcement opening OP-R1, which defines a second rear cover BC2.

Accordingly, the first transmission part TP1' may provide the third inner space PP3' to supply the vibrated air in the fifth space P2-L' to the first reinforcement opening OP-R1.

The passive radiator PR may be disposed in the first reinforcement opening OP-R1. In detail, different from FIG. 13C, the passive radiator PR may cover the other end of the first transmission part TP1' disposed in the first reinforcement opening OP-R1 and may be disposed on a second sidewall portion WP2 of the second rear cover BC2.

Accordingly, the vibrated air in the fifth space P2-L' may be supplied to the third inner space PP3' through the first transmission part TP1', and the air supplied to the third inner space PP3' may be supplied to the first reinforcement opening OP-R1. As the passive vibrating plate PV (refer to FIG. 3C) vibrates in the second direction DR2, the passive radiator PR may output the sound to the upward direction of the electronic module EM'-A.

Referring to FIG. 15B, the electronic module EM'-1A may include a duct DT. The duct DT may be disposed in a first reinforcement opening OP-R1. In detail, the duct DT may be disposed in a transmission opening defined in the first reinforcement opening OP-R1. An outer surface OS-D (refer to FIG. 5A) of the duct DT may cover an inner surface of a first transmission part TP1', which defines the transmission opening.

The duct DT may output a sound, which is supplied thereto through a duct opening by the first transmission part TP1', to the outside, and thus, the sound may be emitted to the upward direction of the electronic module EM'-1A.

Figure 16:
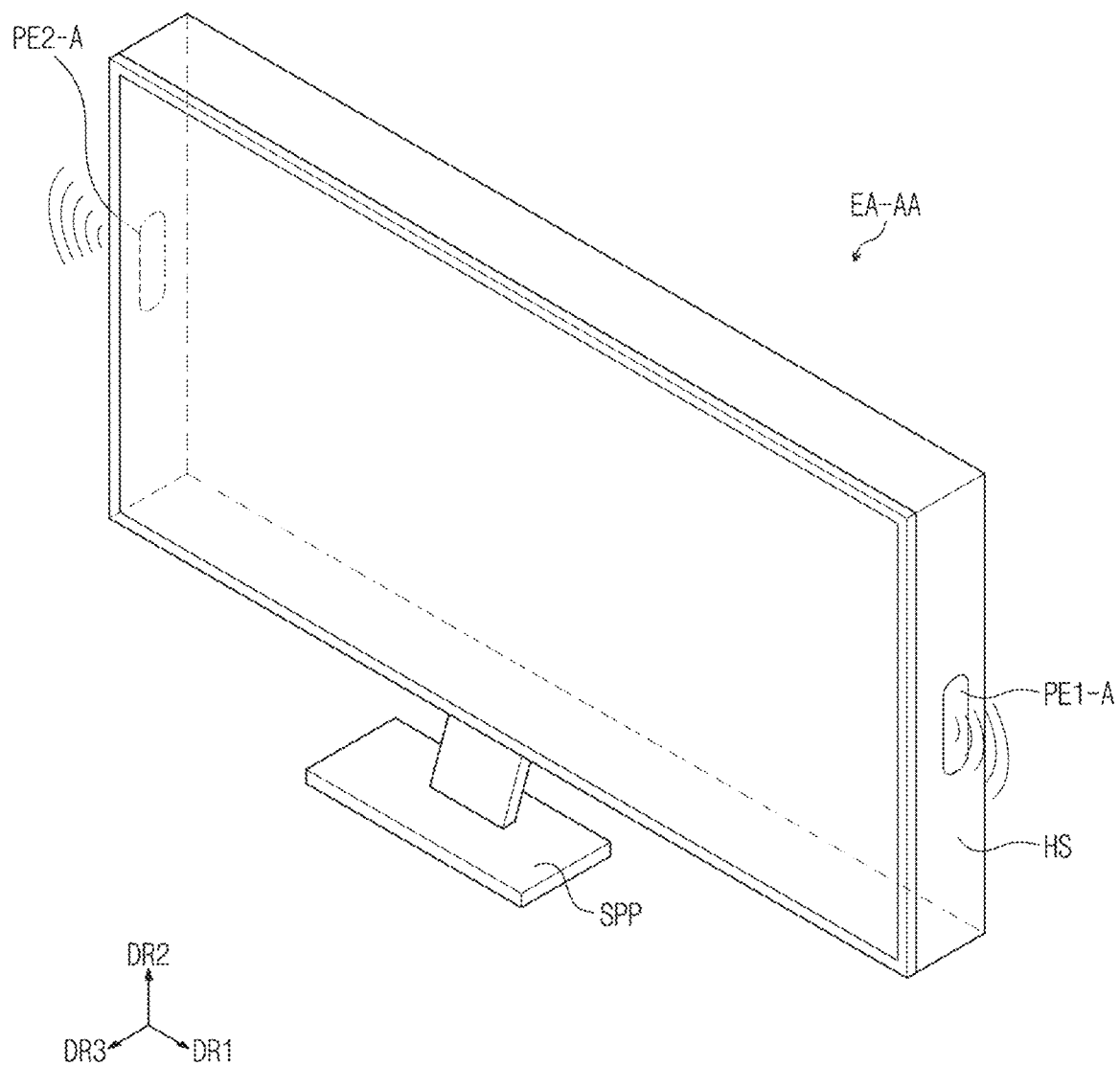
FIG. 16 is a perspective view of an embodiment of an electronic apparatus according to the invention.
Figure 17:
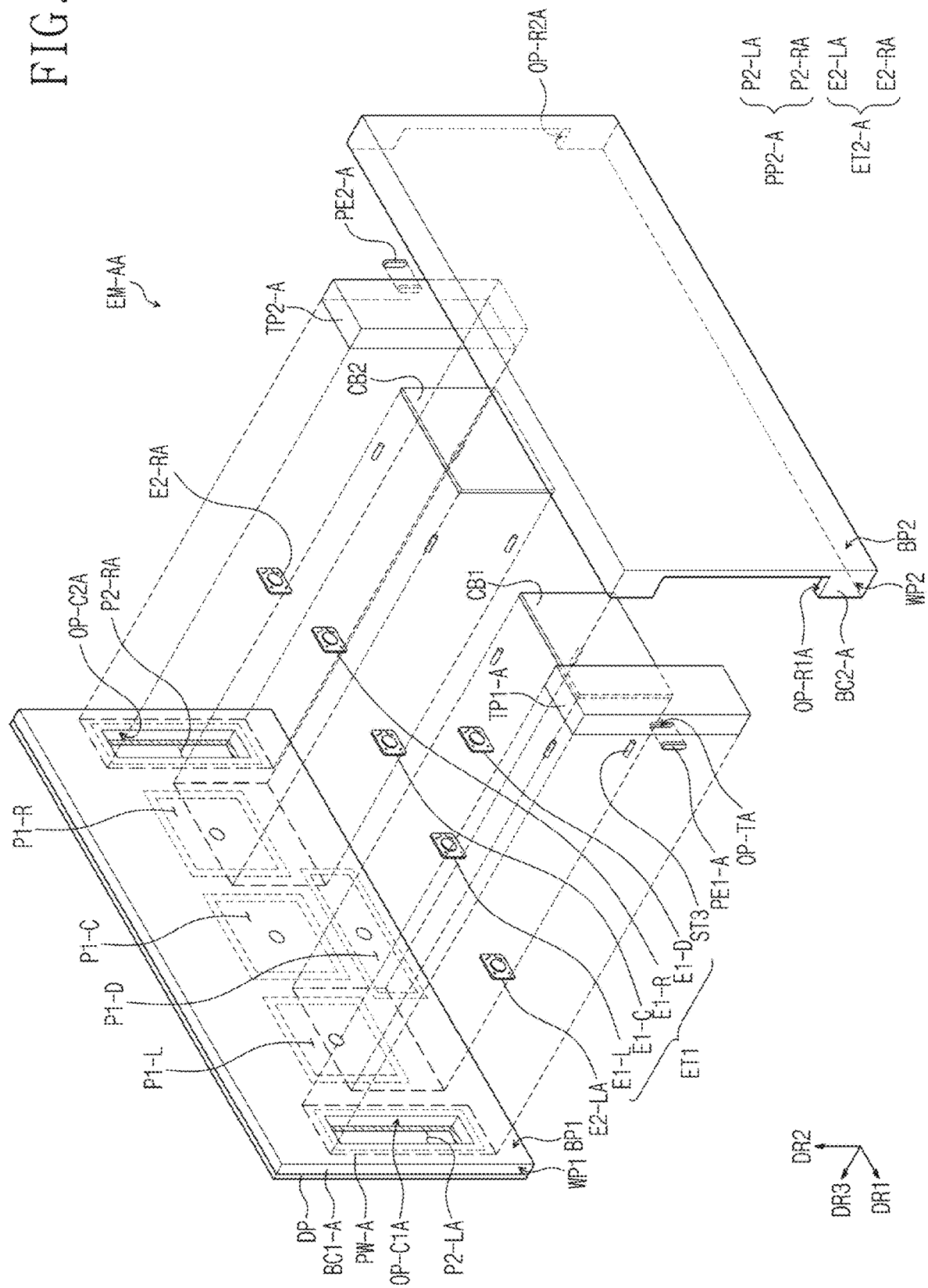
FIG. 17 is an exploded perspective view of an embodiment of some components of an electronic apparatus according to the invention.

FIG. 16 is a perspective view of an embodiment of an electronic apparatus EA-AA according to the invention. FIG. 17 is an exploded perspective view of an embodiment of some components of the electronic apparatus EA-AA according to the invention.

Referring to FIGS. 16 and 17, the electronic apparatus EA-AA may include an electronic module EM-AA and a housing HS.

According to the electronic module EM-AA, some of barrier wall parts PW-A may define second sub-spaces PP2-A including a fifth space P2-LA and a sixth space P2-RA.

The fifth space P2-LA may be spaced apart from a first space P1-L to a left side (the first direction DR1) of the first space P1-L. The sixth space P2-RA may be spaced apart from a third space P1-R to a right side (a direction opposite to the first direction DR1) of the third space P1-R.

In the illustrated embodiment, reinforcement exciters ET2-A may include a first reinforcement exciter E2-LA and a second reinforcement exciter E2-RA.

The first reinforcement exciter E2-LA may be spaced apart from a first main exciter E1-L to a left side of the first main exciter E1-L. The second reinforcement exciter E2-RA may be spaced apart from a third main exciter E1-R to a right side of the third main exciter E1-R.

Reinforcement openings OP-R1A and OP-R2A may be defined through a second sidewall portion WP2 of a second rear cover BC2-A. The reinforcement openings OP-R1A and OP-R2A may include a first reinforcement opening OP-R1A and a second reinforcement opening OP-R2A.

Each of the first reinforcement opening OP-R1A and the second reinforcement opening OP-R2A may be defined through the second sidewall portion WP2 of the second rear cover BC2-A in the first direction DR1. The first reinforcement opening OP-R1A may be defined adjacent to a second side edge, e.g., a left side edge, of a display panel DP, and the second reinforcement opening OP-R2A may be defined adjacent to a third side edge, e.g., a right side edge, of the display panel DP. The first reinforcement opening OP-R1A and the second reinforcement opening OP-R2A may be spaced apart from each other in the first direction DR1.

In the illustrated embodiment, in a direction penetrating through the reinforcement openings OP-R1A and OP-R2A, i.e., in the first direction DR1, the first reinforcement exciter E2-LA may be spaced apart from the first main exciter E1-L, and the second reinforcement exciter E2-RA may be spaced apart from the third main exciter E1-R.

Transmission parts TP1-A and TP2-A may include a first transmission part TP1-A and a second transmission part TP2-A.

The first transmission part TP1-A may overlap the first reinforcement exciter E2-LA and the fifth space P2-LA in the plane. The first transmission part TP1-A may be disposed adjacent to the second side edge, e.g., the left side edge, of the display panel DP.

The second transmission part TP2-A may overlap the second reinforcement exciter E2-RA and the sixth space P2-RA in the plane. The second transmission part TP2-A may be disposed adjacent to the third side edge, e.g., the right side edge, of the display panel DP.

A sub-reinforcement opening OP-TA may be defined through a third sidewall portion WP3 (refer to FIG. 13C) of each of the first transmission part TP1-A and the second transmission part TP2-A. The sub-reinforcement opening OP-TA may be defined through the third sidewall portion WP3 (refer to FIG. 13C) in the first direction DR1.

The sub-reinforcement opening OP-TA defined through the first transmission part TP1-A may be disposed in the first reinforcement opening OP-R1A and may be adjacent to the second side edge, e.g., the left side edge, of the display panel DP. The sub-reinforcement opening OP-TA defined through the second transmission part TP2-A may be disposed in the second reinforcement opening OP-R2A and may be adjacent to the third side edge, e.g., the right side edge, of the display panel DP.

The transmission parts TP1-A and TP2-A, similarly to the transfer units TP1 and TP2 described with reference to FIGS. 12 to 13C, include a third rear surface portion BP3 (refer to FIG. 13C) and the third sidewall portion WP3 (refer to FIG. 13C) bent from the third rear surface portion BP3 along the third direction DR3, however, the shape of the transmission parts TP1-A and TP2-A should not be limited thereto or thereby. The shape of the transmission parts TP1' described with reference to FIGS. 15A and 15B may be applied to the transmission parts TP1-A and TP2-A.

Each of passive elements PE1-A and PE2-A may be one of a passive radiator PR (refer to FIG. 3C) and a duct DT (refer to FIG. 5A). The passive elements PE1-A and PE2-A may include a first passive element PE1-A and a second passive element PE2-A.

In the illustrated embodiment, the first passive element PE1-A may be disposed in the first reinforcement opening OP-R1A and may output the sound to a right side direction of the electronic module EM-AA. The second passive element PE2-A may be disposed in the second reinforcement opening OP-R2A and may output the sound to a left side direction of the electronic module EM-AA. Accordingly, the electronic apparatus EA-AA may implement an overhead sound and more 3D sound. That is, the electronic apparatus EA-AA may implement Dolby Atmos®.

In an embodiment, the electronic module EM-AA may further include a first rear cover BC1-A, and cover openings OP-C1A and OP-C2A may be defined through the first rear surface portion BP1.

Figure 18:
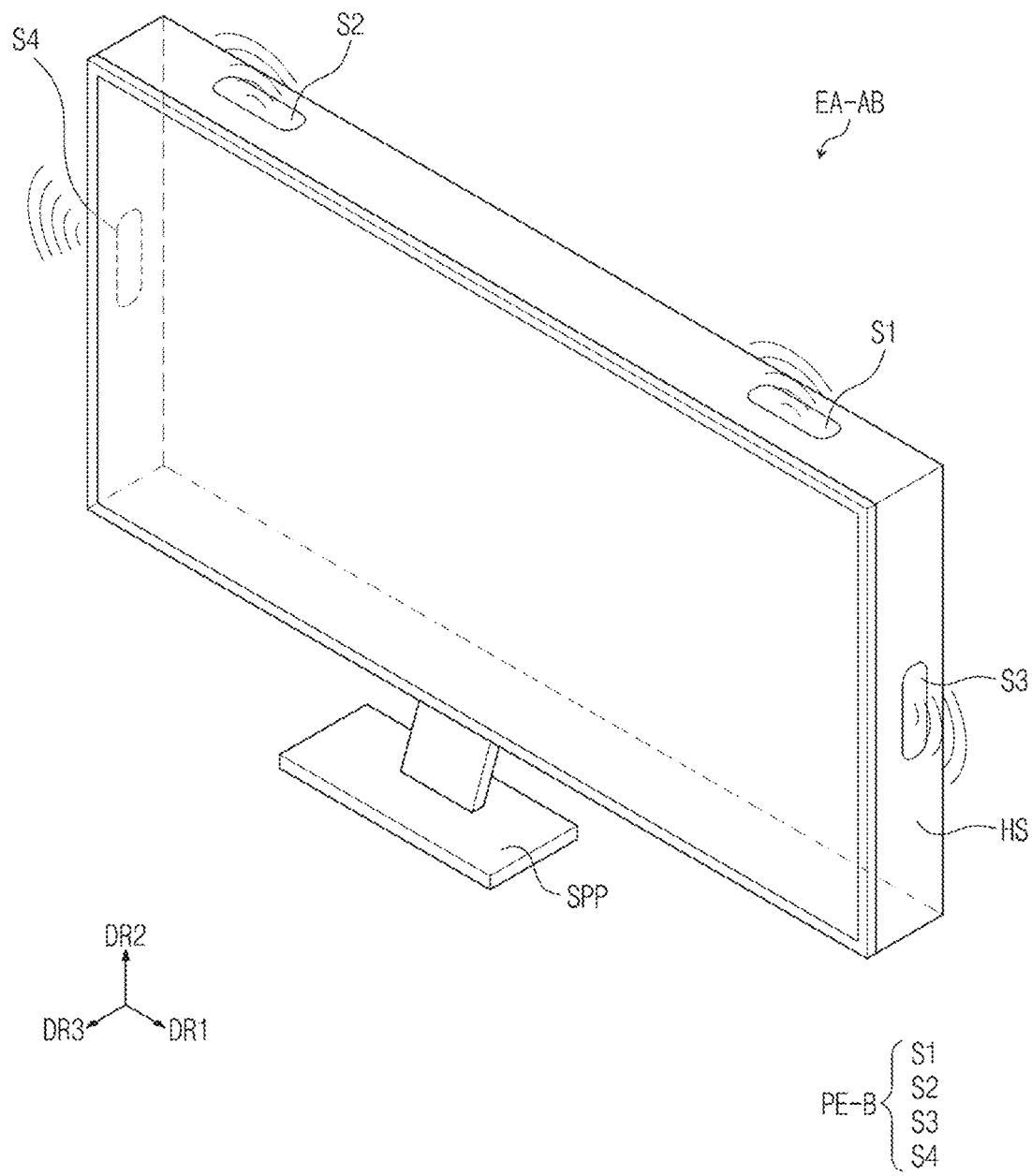
FIG. 18 is a perspective view of an embodiment of an electronic apparatus according to the invention.
Figure 19:
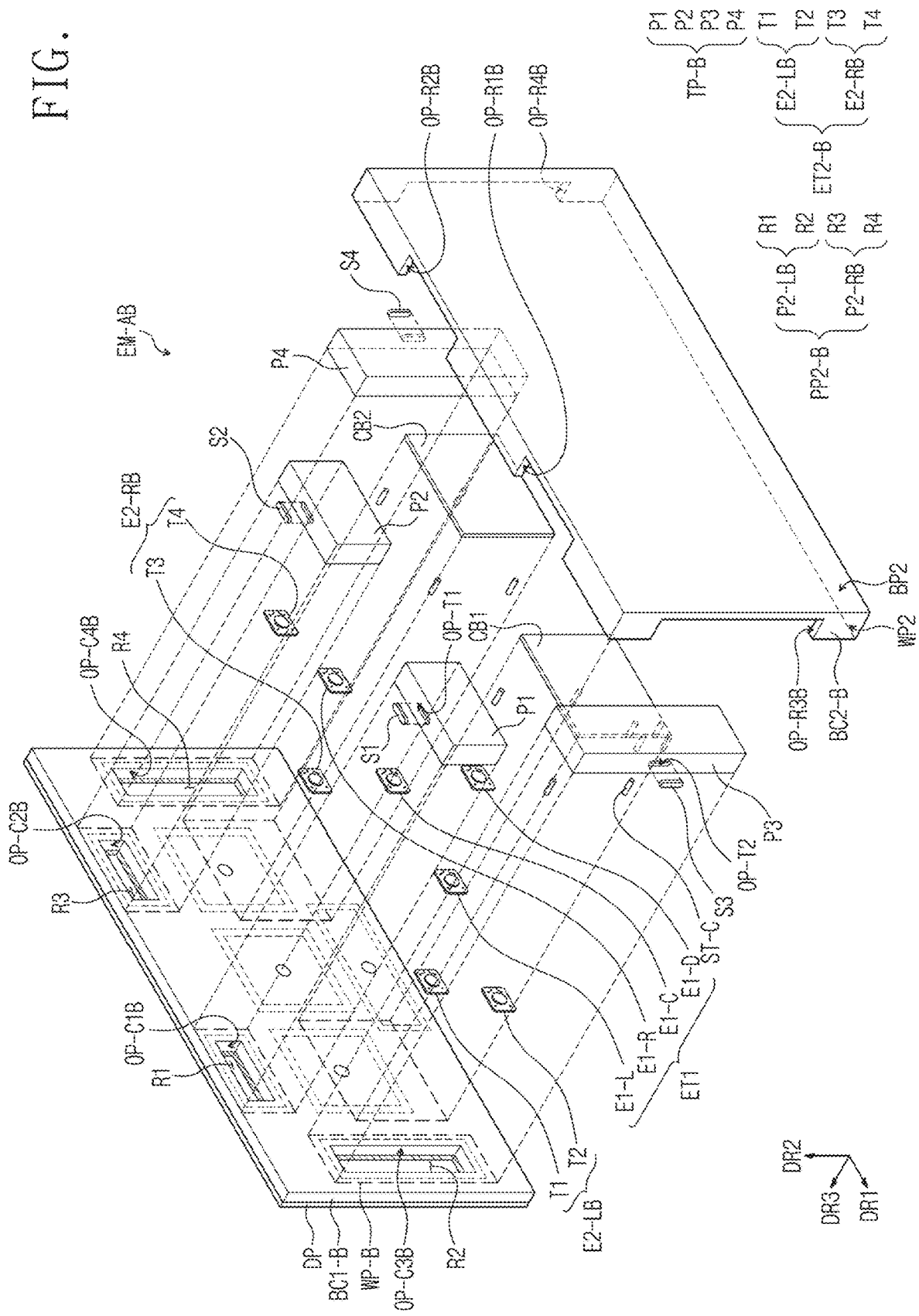
FIG. 19 is an exploded perspective view of an embodiment of some components of an electronic apparatus according to the invention.

FIG. 18 is a perspective view of an embodiment of an electronic apparatus EA-AB according to the invention. FIG. 19 is an exploded perspective view of an embodiment of some components of the electronic apparatus EA-AB according to the invention.

Referring to FIGS. 18 and 19, the electronic apparatus EA-AB may include an electronic module EM-AB and a housing HS.

In the electronic module EM-AB, some of barrier wall parts PW (refer to FIG. 12) may define second sub-spaces PP2-B including fifth spaces P2-LB and sixth spaces P2-RB. The fifth spaces P2-LB may include a first reinforcement space R1 and a second reinforcement space R2, and the sixth spaces P2-RB may include a third reinforcement space R3 and a fourth reinforcement space R4.

The first reinforcement space R1 may be spaced apart from a first space P1-L (refer to FIG. 12) to an upper side of the first space P1-L, and the second reinforcement space R2 may be spaced apart from the first space P1-L to a left side of the first space P1-L. The third reinforcement space R3 may be spaced apart from a third space P1-R (refer to FIG. 12) to an upper side of the third space P1-R, and the fourth reinforcement space R4 may be spaced apart from the third space P1-R to a right side of the third space P1-R.

Reinforcement exciters ET2-B may include first reinforcement exciters E2-LB including a first exciter T1 and a second exciter T2 and second reinforcement exciters E2-RB including a third exciter T3 and a fourth exciter T4.

The first exciter T1 may be spaced apart from a first main exciter E1-L to an upper side of the first main exciter E1-L, and the second exciter T2 may be spaced apart from the first main exciter E1-L to a left side of the first main exciter E1-L. The third exciter T3 may be spaced apart from a third main exciter E1-R to an upper side of the third main exciter E1-R, and the fourth exciter T4 may be spaced apart from the third main exciter E1-R to a right side of the third main exciter E1-R.

Transmission parts TP-B may include first, second, third, and fourth transmission parts P1, P2, P3, and P4.

The first transmission part P1 may overlap the first exciter T1 and the first reinforcement space R1 in a plane. The second transmission part P2 may overlap the third exciter T3 and the third reinforcement space R3 in the plane. Accordingly, the first and second transmission parts P1 and P2 may be disposed adjacent to a first side edge, e.g., an upper side edge, of a display panel DP.

The third transmission part P3 may overlap the second exciter T2 and the second reinforcement space R2 in the plane. The third transmission part P3 may be disposed adjacent to a second side edge, e.g., a left side edge, of the display panel DP. The fourth transmission part P4 may overlap the fourth exciter T4 and the fourth reinforcement space R4 in the plane. The fourth transmission part P4 may be disposed adjacent to a third side edge, e.g., a right side edge, of the display panel DP.

A first sub-reinforcement opening OP-T1 may be defined through each of the first transmission part P1 and the second transmission part P2. The first sub-reinforcement opening OP-T1 may be defined through a third sidewall portion WP3 (refer to FIG. 13C) of each of the first transmission part P1 and the second transmission part P2 in the second direction DR2.

A second sub-reinforcement opening OP-T2 may be defined through each of the third transmission part P3 and the fourth transmission part P4. The second sub-reinforcement opening OP-T2 may be defined through a third sidewall portion WP3 of each of the third transmission part P3 and the fourth transmission part P4 in the first direction DR1.

The transmission parts TP-B, similarly to the transfer units TP1 and TP2 described with reference to FIGS. 12 to 13C, includes a third rear surface portion BP3 (refer to FIG. 13C) and the third sidewall portion WP3 (refer to FIG. 13C) bent from the third rear surface portion BP3 along the third direction DR3, however, the shape of the transmission parts TP-B should not be limited thereto or thereby. The shape of the transmission parts TP1' described with reference to FIGS. 15 and 15B may be applied to the transmission parts TP-B.

Reinforcement openings OP-R1B, OP-R2B, OP-R3B, and OP-R4B may be defined through a second sidewall portion WP2 of a second rear cover BC2-B. The reinforcement openings OP-R1B, OP-R2B, OP-R3B, and OP-R4B may include first, second, third, and fourth reinforcement openings OP-R1B, OP-R2B, OP-R3B, and OP-R4B.

Each of the first and second reinforcement openings OP-R1B and OP-R2B may be defined through the second sidewall portion WP2 in the second direction DR2 and may be adjacent to the first side edge of the display panel DP, e.g., the upper side edge. The first reinforcement opening OP-R1B may overlap the first exciter T1 in the second direction DR2. The second reinforcement opening OP-R2 may overlap the third exciter T3 in the second direction DR2.

Each of the third and fourth reinforcement openings OP-R3B and OP-R4B may be defined through the second sidewall portion WP2 in the first direction DR1. The third reinforcement opening OP-R3B may be adjacent to the second side edge of the display panel DP, e.g., the left side edge, and may overlap the second exciter T2 in the first direction DR1. The fourth reinforcement opening OP-R4B may be adjacent to the third side edge of the display panel DP, e.g., the right side edge, and may overlap the fourth exciter T4 in the first direction DR1.

A passive element PE-B may include first, second, third, and fourth passive elements S1, S2, S3, and S4. In the illustrated embodiment, the first and second passive elements S1 and S2 may be respectively disposed in the first and second reinforcement openings OP-R1B and OP-R2B and may output the sound to the upward direction of the electronic module EM-AB.

The third passive element S3 may be disposed in the third reinforcement opening OP-R3B and may output the sound to the right side direction of the electronic module EM-AB. The fourth passive element S4 may be disposed in the fourth reinforcement opening OP-R4B and may output the sound to the left side direction of the electronic module EM-AB. That is, the electronic apparatus EA-AB may output the sound to the upward direction and both lateral directions.

Accordingly, the electronic apparatus EA-AB may implement the overhead sound and the surround sound, and thus, the more 3D sound may be implemented compared with a case where the sound is emitted in one of the upward direction and the lateral direction. That is, the electronic apparatus EA-AB may implement Dolby Atmos®.

In an embodiment, the electronic module EM-AB may further include a first rear cover BC1-B including a sidewall portion WP-B, and cover openings OP-C1B, OP-C2B, OP-C3B and OP-C4B may be defined through the first rear surface portion BP1.

Although the embodiments of the invention have been described, it is understood that the invention should not be limited to these embodiments but various changes and modifications may be made by one ordinary skilled in the art within the spirit and scope of the invention as hereinafter claimed. Therefore, the disclosed subject matter should not be limited to any single embodiment described herein, and the scope of the invention shall be determined according to the attached claims.

What is claimed is:

1. An electronic apparatus comprising:
   a display panel comprising a first surface through which an image is displayed and a second surface opposite to the first surface;
   a rear cover comprising a rear surface portion spaced apart from the display panel with an inner space interposed therebetween and a sidewall portion connected to the rear surface portion and surrounding the inner space;
   an exciter comprising:
   a vibrator disposed in the inner space to vibrate the display panel; and
   a supporter fixed to the rear surface portion; and
   a passive element which outputs a sound,
   wherein a reinforcement opening is defined through the sidewall portion, the exciter overlaps the reinforcement opening in a direction penetrating through the reinforcement opening, and the passive element is disposed in the reinforcement opening.

2. The electronic apparatus of claim 1, wherein the reinforcement opening is adjacent to a first side edge among edges of the display panel, the passive element outputs the sound to a direction from a second side edge among the edges of the display panel, which faces the first side edge, toward the first side edge, and the first side edge is disposed above the second side edge as viewed the first surface of the display panel.

3. The electronic apparatus of claim 1, wherein the reinforcement opening is adjacent to at least one of a third side edge among edges of the display panel and a fourth side edge among the edges of the display panel, the passive element outputs the sound to at least one direction of a direction from the third side edge to the fourth side edge and a direction from the fourth side edge to the third side edge, and the third side edge and the fourth side edge are spaced apart from each other in a horizontal direction as viewed the first surface of the display panel.

4. The electronic apparatus of claim 1, wherein the sidewall portion and the rear surface portion of the rear cover are unitary with each other.

5. The electronic apparatus of claim 1, wherein the sidewall portion of the rear cover comprises a material different from a material of the rear surface portion of the rear cover.

6. The electronic apparatus of claim 1, wherein the passive element is a passive radiator or a duct.

7. The electronic apparatus of claim 6, wherein the passive radiator comprises:

a passive vibrator vibrated by an air which vibrates in the inner space and comprising a paper material or a metal material; and
an edge portion surrounding the passive vibrator and comprising a rubber.

8. The electronic apparatus of claim 6, wherein a duct opening is defined through the duct, and the duct opening has a circular shape, an oval shape, or an atypical shape with at least one curved side.

9. The electronic apparatus of claim 1, wherein the vibrator comprises a coil to which a current is applied, a magnet of which at least a portion is surrounded by the coil, and a vibrating plate which is disposed on the second surface of the display panel and vibrates with respect to a thickness direction of the display panel, and the supporter is connected to a support stick which extends in a direction from the rear surface portion of the rear cover toward the display panel.

10. The electronic apparatus of claim 1, wherein the passive element is a passive radiator, and the inner space is sealed by the display panel, the rear cover, and the passive radiator.

11. An electronic apparatus comprising:
    a display panel comprising a first surface through which an image is displayed and a second surface opposite to the first surface;
    a circuit board disposed on the second surface of the display panel;
    a first rear cover disposed between the display panel and the circuit board and comprising a first sidewall portion and a first rear surface portion, which define a first inner space;
    a plurality of barrier wall parts defining second inner spaces including a first sub-space and a second sub-space in the first inner space;
    a second rear cover disposed on the first rear surface portion of the first rear cover, comprising:
    a second sidewall portion provided in which a reinforcement opening is defined; and
    a second rear surface portion, the second sidewall portion and the second rear surface portion defining an accommodation space in which the circuit board is accommodated;
    a main exciter which is disposed in the first sub-space and vibrates the display panel;
    a reinforcement exciter which is spaced apart from the main exciter, disposed in the second sub-space, and vibrates the display panel;
    a transmission part disposed in the accommodation space and defining a third inner space connecting the second sub-space and the reinforcement opening; and
    a passive element which is disposed in the reinforcement opening and outputs a sound, wherein the reinforcement opening is adjacent to at least one of a first side edge, a second side edge, and a third side edge facing the second side edge of the display panel, the first side edge is disposed at an upper portion of the display panel, and the second side edge and the third side edge are disposed at opposite side portions of the display panel, respectively.

12. The electronic apparatus of claim 11, wherein the reinforcement exciter is spaced apart from the main exciter in a direction penetrating through the reinforcement opening.

13. The electronic apparatus of claim 11, wherein the reinforcement exciter is disposed above the main exciter, the transmission part is disposed adjacent to the first side edge, and the reinforcement opening is defined adjacent to the first side edge.

14. The electronic apparatus of claim 11, wherein the reinforcement exciter is disposed at a side portion of the main exciter, the transmission part is disposed adjacent to one of the second side edge and the third side edge, and the reinforcement opening is defined adjacent to one of the second side edge and the third side edge.

15. The electronic apparatus of claim 11, wherein the circuit board is spaced apart from the first rear cover and overlaps the main exciter in a plan view.

16. The electronic apparatus of claim 11, wherein the main exciter is provided in plural, and main exciters comprise a first main exciter, a second main exciter, and a third main exciter, which are sequentially arranged in a first direction from the second side edge toward the third side edge.

17. The electronic apparatus of claim 16, wherein the circuit board is provided in plural, circuit boards comprise a first circuit board overlapping the first main exciter and a second circuit board overlapping the third main exciter, and the first circuit board and the second circuit board are spaced apart from each other in the first direction.

18. The electronic apparatus of claim 16, wherein the first sub-space is provided in plural, first sub-spaces comprise a first space in which the first main exciter is disposed, a second space in which the second main exciter is disposed, and a third space in which the third main exciter is disposed, and the first space, the second space, and the third space are sequentially arranged in the first direction and are spaced apart from each other.

19. The electronic apparatus of claim 18, wherein the main exciters further comprise a fourth main exciter disposed under the second main exciter.

20. The electronic apparatus of claim 19, wherein the first sub-spaces further comprise a fourth space accommodating the fourth main exciter, a length of the fourth space in the first direction is greater than a length of the second space in the first direction, and a length of the fourth space in a second direction crossing the first direction is smaller than a length of the second space in the second direction.

21. The electronic apparatus of claim 19, wherein a sound output from the fourth main excitor has a frequency lower than a frequency of a sound output from each of the first main exciter, the second main exciter, and the third main exciter.

22. The electronic apparatus of claim 11, wherein each of the reinforcement exciter, the transmission part, and the reinforcement opening is provided in plural, reinforcement exciters comprise a first reinforcement exciter and a second reinforcement exciter spaced apart from the first reinforcement exciter in a first direction toward the third side edge from the second side edge, transmission parts comprise a first transmission part and a second transmission part spaced apart from the first transmission part in the first direction, and reinforcement openings include a first reinforcement opening and a second reinforcement opening spaced apart from the first reinforcement opening in the first direction.

23. The electronic apparatus of claim 22, wherein each of the first reinforcement exciter and the second reinforcement exciter is disposed above the main exciter, and each of the first reinforcement opening and the second reinforcement opening is defined adjacent to the first side edge.

24. The electronic apparatus of claim 22, wherein the first reinforcement exciter is disposed at a left side of the main exciter, the second reinforcement exciter is disposed at a right side of the main exciter, the first reinforcement opening is defined adjacent to the second side edge, and the second reinforcement opening is defined adjacent to the third side edge.

25. The electronic apparatus of claim 22, wherein each of the first reinforcement exciter and the second reinforcement exciter is provided in plural, first reinforcement exciters are respectively disposed at an upper side of the main exciter and at a left side of the main exciter, and second reinforcement exciters are respectively disposed at the upper side of the main exciter and at a right side of the main exciter.

26. The electronic apparatus of claim 11, wherein the first rear cover further comprises a first support stick extending in a direction toward the second rear surface portion of the second rear cover from the first rear surface portion of the first rear cover, and the main exciter comprises a first vibrator which vibrates the display panel and a first supporter supporting the first vibrator, disposed on the first rear surface portion of the first rear cover, and connected to the first support stick.

27. The electronic apparatus of claim 11, wherein a first cover opening is defined through the first rear surface portion of the first rear cover, an inner side surface of the first rear cover, which defines the first cover opening, is aligned with a barrier wall part dividing the second sub-space among the barrier wall parts, and the transmission part comprises a third sidewall portion and a third rear surface portion, which are disposed on the first rear cover, covering the first cover opening, and defining the third inner space.

28. The electronic apparatus of claim 27, wherein a sub-reinforcement opening is defined through the third sidewall portion of the transmission part, the sub-reinforcement opening is defined in the reinforcement opening, and the passive element is disposed in the sub-reinforcement opening.

29. The electronic apparatus of claim 27, wherein the transmission part further comprises a second support stick extending in a direction toward the display panel from the third rear surface portion, and the reinforcement exciter comprises a second vibrator which vibrates the display panel and a second supporter supporting the second vibrator and connected to the second support stick.

30. The electronic apparatus of claim 11, wherein a second cover opening is defined in the first rear surface portion of the first rear cover, a barrier wall part dividing the second sub-space among the barrier wall parts surrounds the second cover opening in a plan view, a first end of the transmission part is disposed in the second cover opening, and a second end of the transmission part is disposed in the reinforcement opening.

31. The electronic apparatus of claim 30, wherein the first rear cover further comprises a first support stick extending in a direction from the first rear surface portion of the first rear cover toward the second rear surface portion of the second rear cover, and the reinforcement exciter comprises a second vibrator which vibrates the display panel and a second supporter supporting the second vibrator, disposed on the first rear surface portion of the first rear cover, and connected to the first support stick.

32. The electronic apparatus of claim 11, wherein the passive element is a passive radiator or a duct.

33. The electronic apparatus of claim 11, wherein the passive element is a passive radiator, and the second sub-space and the third inner space extending to or from the second sub-space are sealed by the first rear cover, a barrier wall part defining the second sub-space among the barrier wall parts, the transmission part, and the passive radiator.

\* \* \* \* \*